US010512190B2

(12) United States Patent
Anderson et al.

(10) Patent No.: US 10,512,190 B2
(45) Date of Patent: Dec. 17, 2019

(54) SYSTEM FOR MOUNTING A PANEL WITHIN AN ENCLOSURE

(71) Applicant: Hoffman Enclosures, Inc., Anoka, MN (US)

(72) Inventors: William Anderson, Ramsey, MN (US); Nathan L. Westby, Zimmerman, MN (US); Garrett Potvin, Brooklyn Park, MN (US); Larry Krynski, Lakeville, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 252 days.

(21) Appl. No.: 15/342,945

(22) Filed: Nov. 3, 2016

(65) Prior Publication Data

US 2017/0127555 A1    May 4, 2017

Related U.S. Application Data

(60) Provisional application No. 62/250,419, filed on Nov. 3, 2015.

(51) Int. Cl.
| | |
|---|---|
| *H05K 3/30* | (2006.01) |
| *H05K 7/18* | (2006.01) |
| *A47B 47/03* | (2006.01) |
| *H02B 1/30* | (2006.01) |
| *H02B 1/32* | (2006.01) |
| *H02B 1/01* | (2006.01) |

(52) U.S. Cl.
CPC .............. *H05K 7/18* (2013.01); *A47B 47/03* (2013.01); *H02B 1/012* (2013.01); *H02B 1/301* (2013.01); *H02B 1/32* (2013.01)

(58) Field of Classification Search
CPC ......... A47B 47/03; A47B 55/00; A47B 81/00; H02B 1/012; H02B 1/32; H02B 1/301; H05K 7/06; H05K 7/14; H05K 7/18; H05K 13/04
See application file for complete search history.

(56) References Cited

U.S. PATENT DOCUMENTS

| | | | |
|---|---|---|---|
| 1,732,046 | A | 10/1929 | Himmel et al. |
| 1,789,181 | A | 1/1931 | Kennedy |
| 1,846,862 | A | 2/1932 | Guthrie |
| 2,014,033 | A | 9/1935 | Smith |
| 2,015,028 | A | 9/1935 | Gillette |

(Continued)

FOREIGN PATENT DOCUMENTS

| | | | |
|---|---|---|---|
| DE | 8432766 U | 5/1985 | |
| EP | 1164672 A1 | 12/2001 | |
| WO | WO-2005042889 A1 * | 5/2005 | ......... E05D 15/0682 |

*Primary Examiner* — Paul D Kim
(74) *Attorney, Agent, or Firm* — Quarles & Brady LLP

(57) ABSTRACT

Embodiments of the invention provide a system and a method for mounting a panel within an enclosure. Using one or more sets of mounting blocks, the panel and a frame of the enclosure can be secured together in respective horizontal orientations, then collectively rotated to a vertical orientation. The one or more sets of mounting blocks can include a set of stop blocks, each including a respective tongue, and a set of slide blocks, each defining a respective recess when seated on a frame member of the enclosure frame. Each tongue can be configured to nest within a corresponding recess when the mounting blocks secure the panel to a corresponding frame member.

19 Claims, 15 Drawing Sheets

(56) References Cited

U.S. PATENT DOCUMENTS

| | | | |
|---|---|---|---|
| 3,336,709 A | 8/1967 | Berney et al. | |
| 3,846,002 A | 11/1974 | Floetotto | |
| 4,115,966 A | 9/1978 | DeLee | |
| 4,947,597 A | 8/1990 | Simpson | |
| 5,116,161 A | 5/1992 | Faisst | |
| 5,292,189 A | 3/1994 | Lau et al. | |
| 5,380,083 A | 1/1995 | Jones et al. | |
| 5,388,903 A | 2/1995 | Jones et al. | |
| 5,685,662 A | 11/1997 | Rollin et al. | |
| 5,960,599 A | 10/1999 | Schmidt et al. | |
| 6,481,582 B1 | 11/2002 | Rinderer | |
| 6,718,695 B1 * | 4/2004 | Park | E06B 3/4609 49/410 |
| 7,255,409 B2 | 8/2007 | Hu et al. | |
| 7,669,723 B2 | 3/2010 | Kao | |
| 7,784,889 B2 * | 8/2010 | Benner | H02B 1/32 312/223.1 |
| 8,074,583 B2 * | 12/2011 | Lee | A47B 57/54 108/147.13 |
| 8,549,817 B2 | 10/2013 | Burke et al. | |
| 8,763,978 B2 | 7/2014 | Newman et al. | |
| 9,144,310 B2 | 9/2015 | Abel | |
| 2006/0097237 A1 | 5/2006 | McGregor | |
| 2007/0096608 A1 | 5/2007 | Benner | |
| 2010/0079042 A1 | 4/2010 | Eilers et al. | |
| 2014/0001932 A1 | 1/2014 | Westby et al. | |
| 2014/0338729 A1 | 11/2014 | Newman et al. | |
| 2015/0289683 A1 | 10/2015 | Walker | |

* cited by examiner

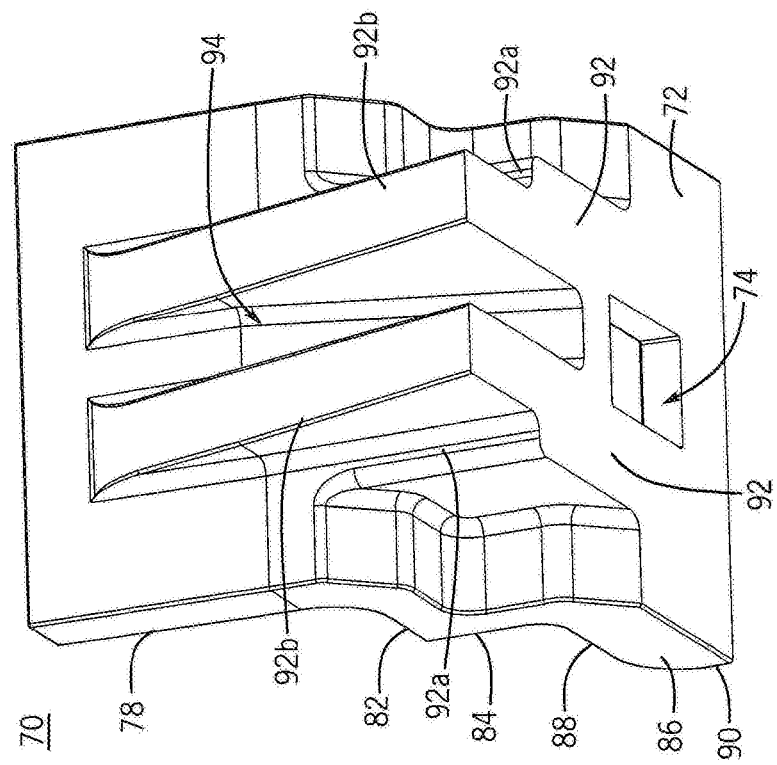
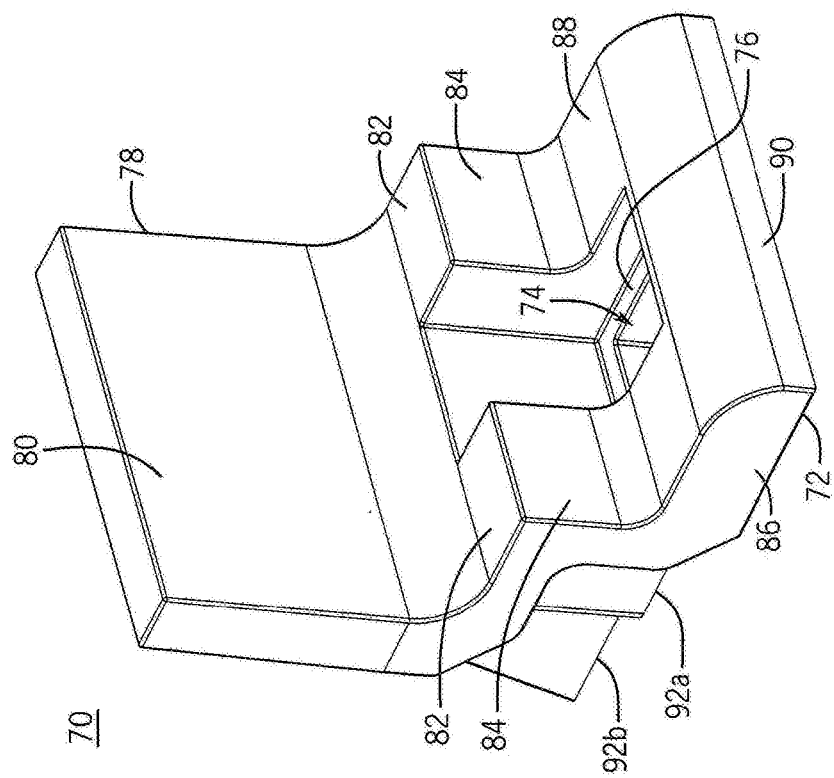

SYSTEM FOR MOUNTING A PANEL WITHIN AN ENCLOSURE

RELATED APPLICATIONS

This application claims priority under 35 U.S.C. § 119 to U.S. Provisional Patent Application No. 62/250,419 filed on Nov. 3, 2015, the entire contents of which are incorporated herein by reference.

BACKGROUND

In order to mount components such as electrical equipment within an electrical enclosure, the components can be secured to a panel and the panel secured to a frame of the enclosure. To efficiently utilize space within the enclosure and to allow relatively easy access to different components, it may be useful to dispose such a panel at a select location (or select locations) within a particular enclosure. Further, it may be useful to mount certain components to the panel before the panel is secured within the enclosure. However, a panel with many components mounted thereto can be relatively heavy (e.g., can weigh 1000 lbs. or more) and relatively unwieldy. Accordingly, using conventional mounting arrangements and methods, it can be relatively difficult to move a loaded panel into place within an enclosure, as well as to hold the panel steady so that it can be secured to the enclosure frame in an appropriate location and orientation.

SUMMARY

Some embodiments of the invention provide a method for mounting a panel within an enclosure using mounting blocks. The panel can be disposed in a horizontal orientation on a support structure. An enclosure frame of the enclosure can be disposed in a horizontal orientation above the panel. The enclosure frame can be lowered into alignment with the panel. A first set of mounting blocks can be secured to the panel and to the frame members to secure the panel to the frame members. The panel and the enclosure frame can then be collectively rotated to a vertical orientation.

Some embodiments of the invention provide a method for mounting a panel within an enclosure using mounting blocks. An enclosure frame of the enclosure can be disposed in a horizontal orientation. A first set of mounting blocks can be secured to frame members of the enclosure, with a stop surface of each mounting block of the first set facing at least partly upwards. The panel can be disposed in a horizontal orientation above the enclosure frame and can be lowered onto the stop surfaces. A second set of the mounting blocks can be secured to the panel and to the frame members to secure the panel to the frame members, with each mounting block of the second set engaging a corresponding mounting block of the first set. The panel and the enclosure frame can then be collectively rotated to a vertical orientation.

Some embodiments of the invention provide a system for mounting a panel within an enclosure. Each slide block of a plurality of slide blocks can include a slide-block support shelf that is configured to receive and support the panel and that is, when the slide block is seated on a support surface of a corresponding one of the frame members, at least partly separated from the support surface by a recess between the slide block and the support surface. Each stop block of a plurality of stop blocks can include a stop surface and can include a tongue configured to nest within the recess between a corresponding one of the slide blocks and the support surface of the corresponding frame member.

The slide blocks can be configured to provide a first installation configuration, in which, with the panel in a horizontal orientation on a support structure and the enclosure frame in a horizontal orientation in alignment with the panel, securing the slide blocks to the panel and to the frame members can secure the panel to the enclosure frame. Also in the first installation configuration, the slide blocks can continue to secure the panel to the enclosure frame as the enclosure frame and the panel are collectively rotated to a vertical orientation.

The slide blocks can also be configured to provide a second installation configuration, in which, with the panel and the enclosure frame in respective horizontal orientations, the stop blocks can be secured to the frame members with the stop surfaces disposed to receive and support the panel as the panel is lowered relative to the enclosure frame. Also in the second installation configuration, with the panel supported on the stop surfaces, the slide blocks can be secured to the frame members with the tongues of the stop blocks nested within the recesses between the slide blocks and the support surfaces of the corresponding frame members. The slide blocks and the stop blocks can collectively secure the panel to the enclosure frame as the enclosure frame and the panel are collectively rotated to the vertical orientation.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 2A is a front, left, top isometric view of a stop block, according to one embodiment of the invention;

FIG. 2B is a rear, right, bottom isometric view of the stop block of FIG. 2A;

DETAILED DESCRIPTION

Figure 1A:
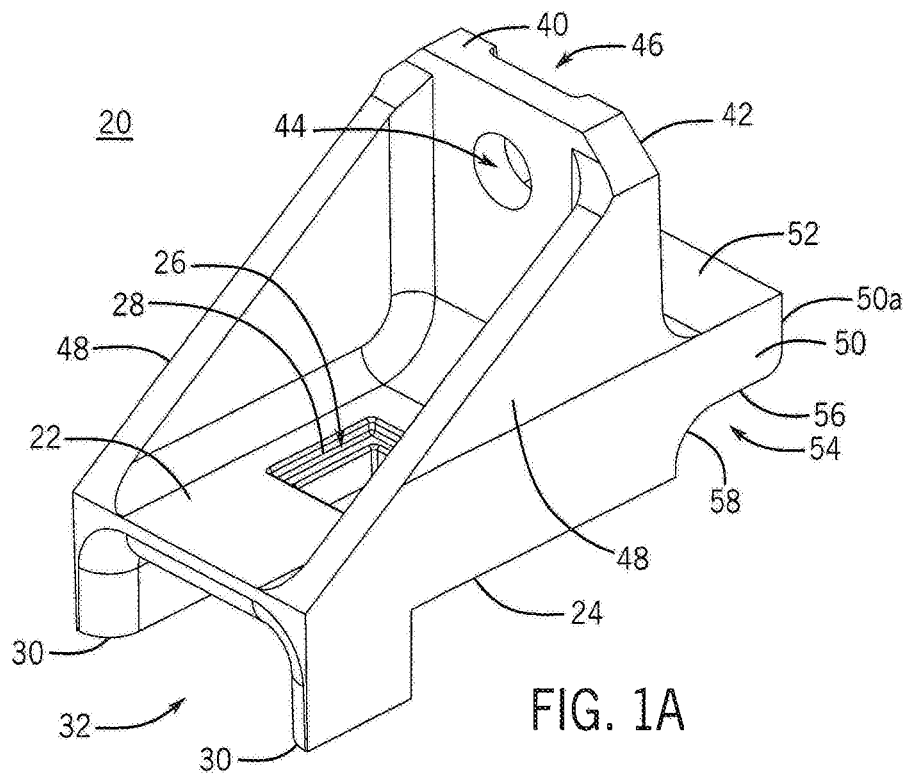
FIG. 1A is a front, right, top isometric view of a slide block, according to one embodiment of the invention.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Likewise, the phrases "at least one of A, B, and C," "one or more of A, B, and C," and the like, are meant to indicate A, or B, or C, or any combination of A, B, and/or C.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein, unless otherwise specified or limited, the term "u-shaped" specifies a shape that includes a base portion, with at least two leg portions extending in generally similar directions from the base portion. In some embodiments, a "u-shaped" member can include leg portions extending from opposite ends of the base portion at substantially right angles to the base portion, with or without curved, chamfered, or otherwise non-square connecting regions between the leg portions and the base portion. In some configurations, a "u-shaped" component can include a base portion that is configured to be disposed above or to the side of the relevant leg portions, when the component is installed for use.

Also as used herein, unless otherwise specified or limited, directional terms such as "forward," "backward," "top," "bottom," "lower," "upper," "left," "right," and so on, are used relative to the perspective of a relevant figure. As such, unless otherwise specified or limited, it will be understood that use of such terms is not intended to exclude different (e.g., horizontally or vertically reversed) orientations, locations, or movements.

Also as used herein, in the context of enclosures, the term "horizontal orientation" generally refers to a reclined orientation of an enclosure, whereas the term "vertical orientation" generally refers to an orientation in which the enclosure is intended to be installed. For example, an electrical enclosure (or enclosure frame, and so on) that is resting on its sides or back on a support surface (e.g., a work table or the ground) can be considered to be in the "horizontal orientation." In contrast, when the electrical closure (or enclosure frame, and so on) is resting upright on its base (or equivalent structure), it can be considered to be in the "vertical orientation."

As discussed above, it can be generally useful to mount electrical equipment (e.g., computer electronics) to a panel that is in turn secured at an appropriate location relative to a support frame of an enclosure. Also as discussed above, however, attaching electrical equipment to a panel can result in a panel assembly that can be relatively heavy and unwieldy.

Embodiments of the invention provide an improved system and related methods for securing panels to enclosure frames, including for panels to which electrical equipment has been (or will be) attached. Generally, sets of mounting blocks can be used to secure panels to enclosure frames in various orientations, including horizontal orientations and vertical orientations.

In some embodiments, a mounting block for supporting a panel can be configured as a slide block that is generally configured to be secured to a panel and to a frame member of an enclosure. Further, the slide block can be configured to slide relatively easily, and with varying degrees of structurally-imposed guidance, along the frame member. Accordingly, when secured to a panel, the slide block can enable the panel to be slid along a frame member to a desired mounting location, then secured to the frame member. In some embodiments, the slide block can also be used to enable installation of a panel (e.g., with a full complement of electrical equipment) with the panel in a horizontal orientation.

Some embodiments of the invention further provide a mounting block configured as a stop block that is generally configured to engage a corresponding slide block and to be secured to a frame member of an enclosure. When engaged with a slide block and secured to a frame member, the stop block can help to support a panel that is secured to the slide block, while also helping to relatively firmly anchor the slide block (and the panel) at a desired location. Further, in some embodiments, the stop block can be used to enable installation of a panel with the panel in a horizontal orientation.

Figure 1B:
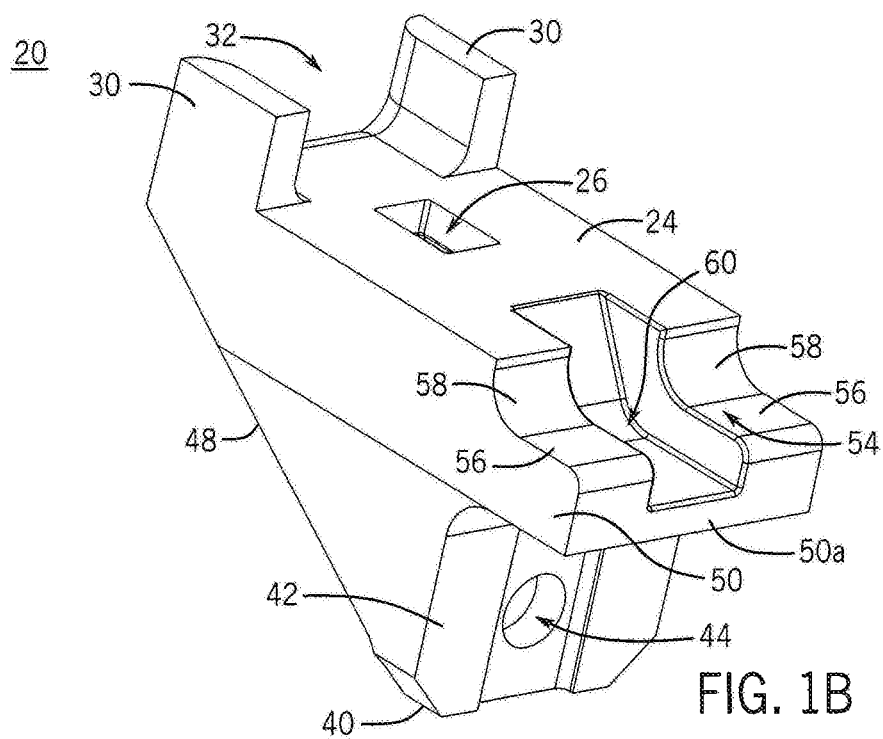
FIG. 1B is a rear, left, bottom isometric view of the slide block of FIG. 1A.

FIGS. 1A and 1B illustrate a mounting block, according to one embodiment of this disclosure, configured as a slide block 20 for securing a panel within an enclosure. In some embodiments, the slide block 20 (and other mounting blocks according to this disclosure) can be used in a mounting arrangement for a panel of an electrical enclosure, such as a panel for supporting network equipment or other components of electrical systems. In some embodiments, the slide block 20 (and other mounting blocks according to this disclosure) can be used in other settings, including with other types of enclosures.

In different embodiments, a mounting block such as the slide block 20 can be formed from a variety of different materials. In some embodiments, the slide block 20 can be a single-piece, single-material, molded composite part. In some embodiments, the slide block 20 can be formed from other types of materials. In some embodiments, the slide block 20 can include a coating, tape, or other surface application or treatment (not shown) to reduce the coefficient friction of part or all of the slide block 20.

The slide block 20 includes a slide portion 22, which includes a slide surface 24 that is configured to seat on and slide along a support surface, such as an inward facing support surface of a frame member of an enclosure (not shown in FIGS. 1A and 1B). In the embodiment illustrated, the slide surface 24 is substantially flat, in order to encourage relatively uniform contact with a frame member, as well as relatively smooth sliding of the slide portion 22 along the frame member (e.g., via contact of the slide surface 24 with the frame member).

Generally, a mounting block can include at least one mounting feature that can be used to secure the mounting block to a frame member of an enclosure. The slide block 20, for example, includes a mounting feature configured as a rectangular mounting aperture 26, with an internal shoulder 28. In other embodiments, other types of mounting features are possible, including round or shoulder-less apertures, clips, plungers, quick-lock and quick-release mechanisms, and so on. In the embodiment illustrated in FIGS. 1A and 1B, the slide surface 24, and the slide portion 22 generally, are interrupted by the mounting aperture 26. This may be useful, for example, to secure the slide block 20 to a frame member that includes mounting holes along an inward-facing support surface. In other embodiments, other configurations are possible.

At a first end of the slide block 20, first and second guide legs 30 extend away from the slide portion 22, on the same side of the slide portion 22 as the slide surface 24 (e.g., the lower side, from the perspective of FIG. 1A). The guide legs 30 are spaced apart from each other so as define a guide channel 32 that is generally aligned with the slide surface 24. With an appropriate width of the guide channel 32 (i.e., as measured left to right, from the perspective of FIG. 1A), the guide legs 30 can extend along opposite sides of a frame member when the slide surface 24 is seated on the frame member. For example, when the slide surface 24 is seated on a top, inner support surface of a frame member, the guide legs 30 can extend downward along opposite sides of the frame member to guide movement of the slide block 20 along the frame member. In some embodiments, the guide channel 32 can have a width that provides for a relatively small (or even negative) clearance between the guide legs 30 and the relevant frame member. Accordingly, for example, during an axial sliding of the slide block 20 along the frame member, lateral movement of the slide block 20 relative to the frame member can be substantially limited. In some embodiments, one or both ends of the guide legs 30 can be rounded (as illustrated in FIGS. 1A and 1B) or otherwise contoured to assist a user in aligning the slide block 20 with a relevant frame member.

To help secure a panel to the slide block 20, an attachment feature configured as an attachment flange 40 extends away from the slide portion 22 in a generally opposite direction to the guide legs 30. Accordingly, when the slide surface 24 is seated on a frame member with the guide legs 30 extending along sides of the frame member, the attachment flange 40 can extend away from the frame member to present a contact surface 42 for engagement with a panel.

In some embodiments, a mounting feature, such as a round mounting aperture 44, can be disposed on the attachment flange 40, in order to assist in securing a panel to the slide block 20. In the embodiment illustrated, the attachment flange 40 includes a rectangular recess 46 extending into the contact surface 42, with the aperture 44 disposed in alignment with the recess 46.

Various features can be included on a mounting block for ease of manufacturing or assembly, or for structural strength, including ribs, chamfers, rounded corners, or other structures. As such, for example, the slide block 20 includes a number of rounded internal and external corners. Further, opposite the contact surface 42 of the slide block 20, the attachment flange 40 is reinforced and strengthened by a pair of gussets 48 that extend from an elongate end at the attachment flange 40 to the end of the slide portion 20 with the guide legs 30 (and to the end of the slide block 20, generally).

Opposite the attachment flange 40 from the legs 30, the slide block 20 includes a support flange 50, with a support shelf 52 on a side of the support flange 50 that is opposite the slide surface 24 (e.g., on a top side of the support flange, from the perspective of FIG. 1A). As also discussed below, the support shelf 52 can be configured to support at least part of an edge of a panel in order to move and mount the panel relative to an enclosure frame. In the embodiment illustrated, the support shelf 52 is spaced apart from the slide surface 24 along a direction perpendicular to the slide surface 24 (e.g., disposed above the slide surface 24, from the perspective of FIG. 1A). Accordingly, when the slide surface 24 is seated on a frame member, the support shelf 52 is disposed to support a panel at a location that is spaced apart from the frame member.

Further, due to the relative disposition of the slide surface 24 and the support shelf 52, as well as to the thickness of the slide portion 22, a mating recess 54 extends into the slide block 20, starting at an end 50a of the support flange, between the support flange 50 and the plane of the slide surface 24 (e.g., below the support flange 50, from the perspective of FIG. 1A). The mating recess 54 can include one or more support surfaces 56 as well as one or more stop surfaces 58, as also discussed below. As illustrated, the support surfaces 56 generally extend in parallel with the support shelf 52, and at least part of the stop surfaces 58 generally extend perpendicularly to the support surfaces 56, with a rounded corner at the transition between the support surfaces 56 and the stop surfaces 58. In other embodiments, other configurations are possible.

In the embodiment illustrated, the support flange 50 also includes a clearance recess 60 disposed within the mating recess 54, with the clearance recess 60 separating the two support surfaces 56, and the two stop surfaces 58, from each other. In some embodiments, the clearance recess 60 extends farther than the mating recess 54 along the slide block 20. For example, in the embodiment illustrated, the clearance recess 60 extends into the slide surface 24, below the attachment flange 40.

FIGS. 2A and 2B illustrate another mounting block, according to one embodiment of the disclosure, configured as a stop block 70 for securing a panel within an enclosure. In some embodiments, the stop block 70 (and other mounting blocks according to this disclosure) can be used in a mounting arrangement for a panel of an electrical enclosure, such as a panel for supporting network equipment or other components of electrical systems. In some embodiments, the stop block 70 (and other mounting blocks according to this disclosure) can be used in other settings, including with other types of enclosures. Similarly to the slide block 20, the stop block 70 can be formed from one or more of a variety of materials, including composite materials, and can sometimes include coatings, tapes, or other surface applications or treatments.

The stop block 70 includes a contact surface 72 configured to seat on a support surface, such as an inward-facing support surface of a frame member of an enclosure (not shown in FIGS. 2A and 2B). In the embodiment illustrated, the contact surface 72 is substantially flat, in order to encourage relatively uniform contact with a frame member. In other embodiments, other configurations are possible, including with contact surfaces having non-flat geometry.

As also noted above, a mounting block can generally include at least one mounting feature that can be used to secure the mounting block to a frame member. The stop block 70, for example, includes a mounting feature configured as a rectangular mounting aperture 74 with an internal shoulder 76. As illustrated, the contact surface 72 (and other features of the stop block 70) are interrupted by the mounting aperture 74. In other embodiments, other types of mounting features are possible, including round or shoulderless apertures, clips, plungers, quick-lock and quick-release mechanisms, and so on.

To help limit movement of a panel relative to the stop block 70, a blocking feature configured as a stop flange 78 extends away from the contact surface 72. In this way, for example, when the contact surface 72 is seated on a frame member, the stop flange 78 can extend away from the contact surface 72 in order to present a stop surface 80 to limit movement of a panel. In some embodiments, and as also discussed below, the stop surface can limit movement of a panel in combination with the attachment flange 40 of FIGS. 1A and 1B.

In the embodiment illustrated, no mounting feature (e.g., round or other aperture) is included on the stop flange 78 to attach the stop block 70 directly to a panel. In other embodiments, one or more mounting features of various configurations can be provided (e.g., to facilitate bolting of the stop flange 78 to the relevant panel).

At an end of the stop flange 78 that is closest to the contact surface 72 at the bottom end of the stop flange 78, from the perspective of FIG. 2A), the stop block 70 includes a support shelf 82. As also discussed below, the support shelf 82 can be configured to support at least part of an edge of a panel when the contact surface 72 is seated on a frame member. In the embodiment illustrated, the support shelf 82 is spaced apart from the contact surface 72 along a direction perpendicular to the contact surface 72 (e.g., above the contact surface 72, from the perspective of FIG. 2A), with part of the mounting aperture 74 extending through the support shelf 82. In other embodiments, other configurations are possible.

At an end of the support shelf 82 opposite the stop flange 78, a stop surface 84 extends away from the support shelf 82 and the stop flange 78 towards the contact surface 72 (e.g., generally downward, from the perspective of FIG. 2A). At an end of the stop surface 84 opposite the support shelf 82, the stop surface 84 transitions to a tongue 86, which includes a support surface 88 opposite the contact surface 72 and a stop surface 90 opposite the stop surface 84 (and at the end of the stop block 70 generally). As also discussed below, the tongue 86 can be configured to nest within the mating recess 54 defined by the slide block 20 (see, e.g., FIGS. 1A and 1B), including with relatively small (or even negative) clearance.

As illustrated, the support shelf 82 is generally parallel with a part of the stop surface 90 that is adjacent to the contact surface 72, and is generally perpendicular to at least part of the stop surfaces 80 and 84. Further, transitions between various combinations of the surface 80, the support shelf 82, and the surfaces 84, 88, and 90 are generally characterized by rounded corners. In other embodiments, other configurations are possible.

To help support the stop block 70 relative to a frame member, the stop block 70 includes a set of support columns 92 that extend from the contact surface 72 to other parts of the stop block 70. In the embodiment illustrated, the support columns 92 are partly separated from each other by a central gap 94. Further, each of the support columns 92 is configured as a compound column, with respective first and second portions 92a and 92b. Generally, the first portion 92a of each of the support columns 92 is disposed substantially below the support shelf 82 and between the respective second portion 92b and the tongue 86. The first portions 92a of the support columns 92 also generally exhibit relatively large widths compared to the second portions 92b of the support columns 92. The first portions 92a of the support columns 92 can accordingly help to provide appropriate structural strength to the stop block 70, including when the support shelf 82 is used to support a relatively heavy panel. In other embodiments, other configurations are possible.

Also in the embodiment illustrated, the second portions 92b of the support columns 92 generally extend at a non-right angles relative to the contact surface 72, the stop surface 80, and the stop flange 78 generally. Accordingly, the ends of the second portions 92b of the support columns 92 that are adjacent to the contact surface 72 generally define an end of the stop block 70 (and the contact surface 72) that is spaced apart from the stop flange 78 in a direction extending in parallel with the contact surface 72 (e.g., rearward, from the perspective of FIG. 2A). This can be useful, for example, to provide structural resistance to excessive rocking or flexing of the stop flange 78, and the stop block 70 generally, in response to moments imposed on the stop block 70 by contact of a panel with the stop surface 80 of the stop flange 78.

Figure 3:
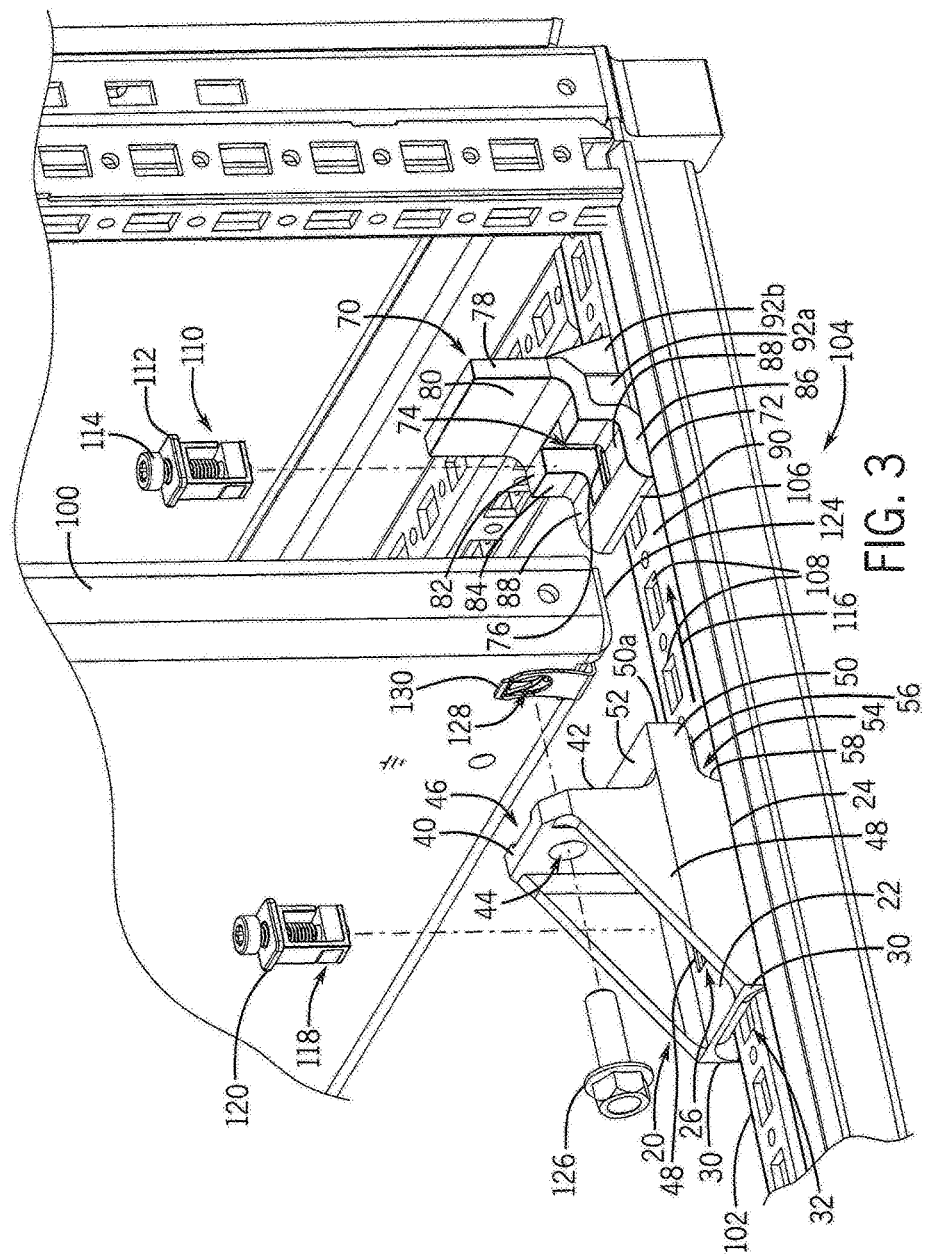
FIG. 3 is a front, right, top isometric view of a method for installing a panel into an enclosure using the slide block of FIG. 1A and the stop block of FIG. 2A.

FIG. 3 illustrates a method of using the stop block 70 and the slide block 20 in a particular mounting arrangement, to secure a panel 100 (e.g., in a fully loaded state) to a frame member 102 of an enclosure frame 104. In one implementation, the stop block 70 is positioned on the frame member 102, with the contact surface 72 of the stop block 70 seated squarely on an upper support surface 106 of the frame member 102. With the contact surface 72 seated on the support surface 106, the rectangular mounting aperture 74 of the stop block 70 can be aligned with a select one of various mounting apertures 108 on the frame member 102 (only some of which are labeled in FIG. 3, for clarity of presentation). A fastener, such as a cage nut 110, can then be inserted through the aligned mounting apertures 74 and 108, and engaged (e.g., tightened) to secure the stop block 70 to the frame member 102. In some cases, the shoulder 76 of the mounting aperture 74 is configured to support a flange 112 of the cage nut 110 (or similar feature of another fastener) so that the bulk of the cage nut 110 (e.g., excluding a bolt head 114) can be disposed below the support surface 88 of the stop block 70.

With the stop block 70 secured to the frame member 102 as described above (or otherwise), both the first and second portions 92a and 92b of the support columns 92 of the stop block 70 are firmly seated on the support surface 106 of the frame member 102. As noted above, the support columns 92, and in particular the second portions 92b thereof, angle away from the stop flange 78 of the stop block 70 (e.g., to the right, as illustrated in FIG. 3) to define an extended geometry of the stop block 70. Accordingly, the support columns 92, and particularly the second portions 92b thereof, in combination with the cage nut 110 (or other fastener) can help to resist a moment imposed by the panel 100 on the stop block 70 via the stop flange 78 (or otherwise).

As part of the installation illustrated in FIG. 3, the slide block 20 is also positioned on the frame member 102, with the contact surface 42 of the slide block 20 seated (e.g., squarely) on the support surface 106 of the frame member 102. With the contact surface 42 seated on the support surface 106, the slide block 20 is then slid towards the stop block 70 (e.g., as indicated by the arrow 116) until the tongue 86 of the stop block 70 is nested within the mating recess 54 of the slide block 20 (i.e., between the support flange 50 of the slide block 20 and the support surface 106 of the frame member 102). As illustrated in a similar mounting configuration of FIG. 4, for example, this can result in the support surfaces 56 of the slide block 20 bearing on the support surface 88 of the stop block 70, and the stop surface 58 of the slide block 20 bearing on the stop surface 90 of the stop block 70. This, in turn, can provide a relatively stable arrangement for transmission of supportive force for the panel 100 from the frame member 102 through the tongue 86 and the support flange 50. Further, in some embodiments, the physical contact of the stop surfaces 58 and 90 (or other features of the slide block 20 and the stop block 70) can provide a tactile feedback to a user to indicate when the tongue 86 is appropriately nested within the mating recess 54 and, accordingly, when the slide block 20 and the stop block 70 are generally correctly installed.

To secure the slide block 20 to the frame member 102, the mounting aperture 26 can be aligned with another of the mounting apertures 108 of the frame member 102. With the end 50a of the support flange 50 appropriately spaced from the mounting aperture 26 in view of the spacing of the spacing of the mounting apertures 108, this alignment can occur automatically when the tongue 86 is fully nested within the mating recess 54 and the stop block 70 is secured to the frame member 102 (e.g., using the cage nut 110, as described above).

Once the slide block 20 has been appropriately positioned, a fastener, such as a cage nut 118 similar to the cage nut 110, can be inserted through the aligned mounting apertures 26 and 108, and tightened to secure the slide block 20 to the frame member 102. As with the cage nut 110 and the stop block 70, the shoulder 28 of the mounting aperture 26 can be configured to support a flange 120 of the cage nut 118 (or similar feature of another fastener), so that the bulk of the cage nut 118 (e.g., excluding a bolt head, as illustrated) can be disposed below the support surface 88 of the stop block 70.

As illustrated in FIGS. 1A and 1B, the slide block 20 generally includes the clearance recess 60 within the mating recess 54. This can be useful, for example, in order to allow the nesting of the tongue 86 within the mating recess 54, even if the bolt head 114 (or other feature of a fastener) extends above the support surface 88 of the tongue 86. For example, referring again to FIG. 3, when the cage nut 110 secures the stop block 70 to the frame member 102 (not illustrated), the clearance recess 60 (not shown in FIG. 3) can slide over the bolt head 114 as the mating recess 54 of the slide block 20 is moved over the tongue 86 of the stop block 70. Accordingly, for example, the support surface 56 of the slide block 20 can bear on the support surface 88 of the stop block 70 without interference from the bolt head 114 or other part of the cage nut 110.

Figure 4:
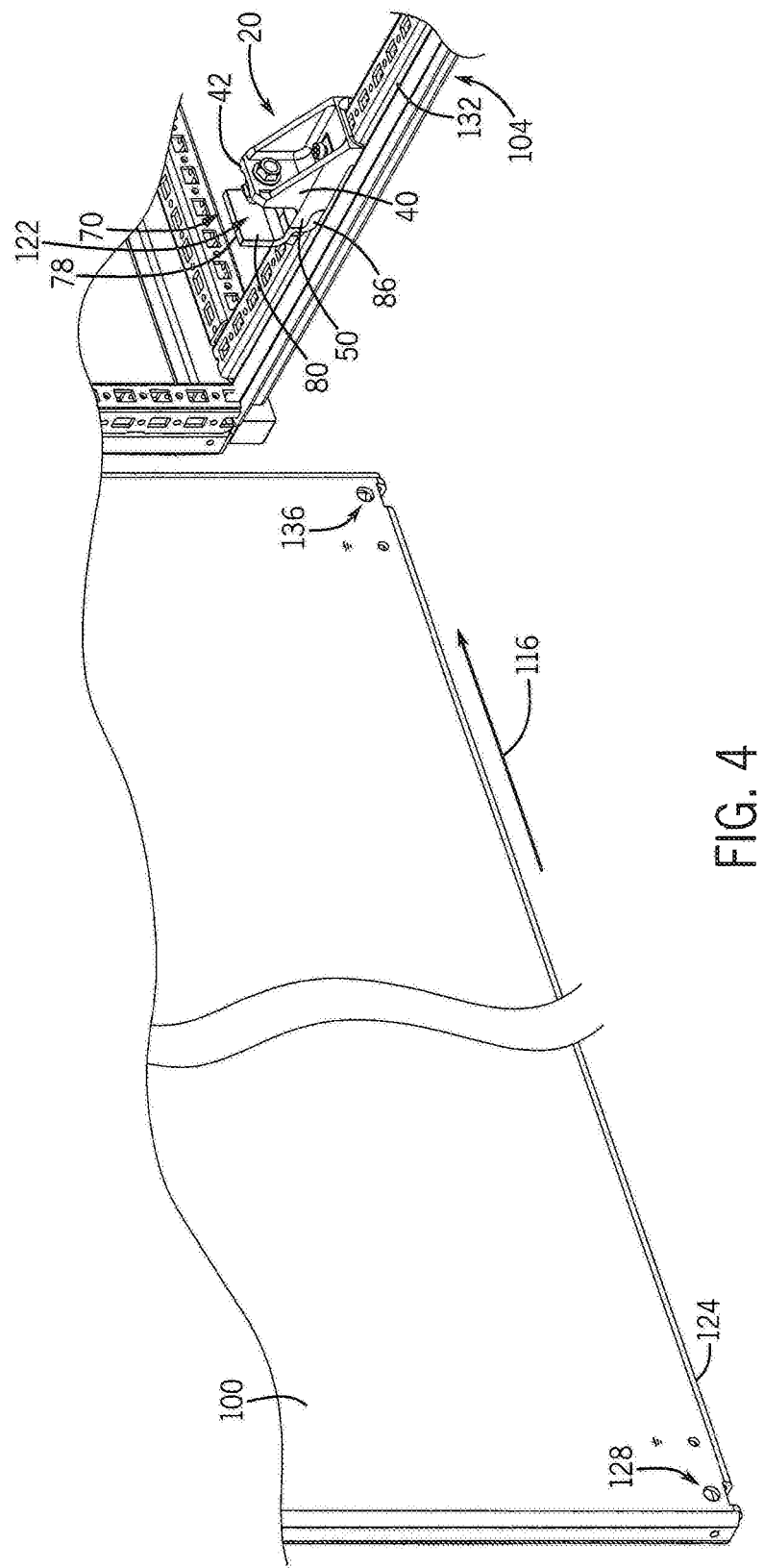
FIG. 4 is a front, left, top isometric view of another method for installing a panel into an enclosure using the slide block of FIG. 1A and the stop block of FIG. 2A.

As illustrated in FIG. 4 in particular, with the tongue 86 nested within the mating recess 54, the contact surface 42 and support shelf 52 of the slide block 20, along with the support shelf 82 and stop surface 80 of the stop block 70, generally define u-shaped support channel 122 that is sized to receive the panel 100, with the support shelves 52 and 82 generally aligned and in parallel with each other. In some embodiments, a width of the channel 122 (e.g., as measured between the contact surface 42 and the stop surface 80) can provide a relatively small (or negative) clearance for insertion of the panel 100. In this way, for example, the attachment flange 40 (via the contact surface 42) and the stop flange 78 (via the stop surface 80) can substantially limit movement of the panel 100 once the panel 100 is seated within the channel 122. Further, as also described above, due to the engagement of the support surfaces 56 and 88 with each other, a lower end 124 of the panel 100 can be strongly supported by the frame member 102 via the tongue 86 and support flange 50, when seated on the support shelves 52 and 82 within the channel 122.

To further secure the panel 100 in place, a bolt 126 (or other fastener) can be inserted through the mounting aperture 44 in the slide block 20 and through a threaded hole 128 (or other mounting feature) on the panel 100. The bolt 126 can then be tightened, in order to firmly secure the panel 100 to the attachment flange 40 at the contact surface 42. In some embodiments, the recess 46 on the contact surface 42 can be dimensioned to accommodate a clip 130 (or other feature) on the panel 100, so that the panel 100 can be seated relatively firmly on the contact surface 42 despite the protrusion of the clip 130 (or other feature) beyond the relevant face of the panel 100.

The method presented above of mounting the panel 100 within the enclosure frame 104 includes express discussion only of mounting the panel using a mounting arrangement with a single instance of the stop block 70 and of the slide block 20. To fully secure the panel 100 in place, it may be useful to repeat the operations discussed above (or variations thereupon) with other sets of mounting blocks configured similarly to the slide block 20 and the stop block 70. For example, a set of stop and slide blocks similar to the stop block 70 and the slide block 20 can be used to secure each corner, or other parts of the panel 100 to a respective frame member of the enclosure frame 104. For convenience of discussion herein, multiple slide blocks and stop blocks of a mounting arrangement may sometimes each be referred to, respectively, as simply the slide block 20 and the stop block 70, with directional qualifiers (e.g., top, bottom, top left, and so on) distinguishing particular instances of particular mounting blocks as appropriate.

Of note, the methods discussed above and below, including the order of various operations of the methods, are presented as an example only. For example, in the method discussed above, the slide block 20 and the stop block 70 can be secured to the frame member 102 before the panel 100 is disposed to be supported by the slide block 20 and the stop block 70. In other implementations, as also discussed below, the panel 100 can be secured to the slide block 20 (or multiple instances thereof) before the slide block 20 is moved to a final position on the frame member 102. Similarly, in some implementations, the stop block 70 can be secured to the frame member 102, or engaged with the slide block 20, after the slide block 20 has been moved to a final position, or at various other times.

In some implementations, the slide block 20 can be secured to the frame member 102 before the stop block 70, and the stop block 70 then slid along the frame member 102 until the tongue 86 is appropriately nested within the mating recess 54. In this regard, for example, it will be understood that the labels of "slide" and "stop" for the slide block 20 and the top block 70 (and other components), as well as similar other qualifiers used herein (e.g., regarding the "stop" surface 80), are used as labels of convenience only and are not, for example, intended to exclude the slide block 20 (or other slide blocks) from serving as a fixed stop, or to exclude the stop block 70 (or other stop blocks) sliding or otherwise moving during a particular panel-mounting operation.

FIG. 4 illustrates another example method of mounting the panel 100 within the enclosure frame 104. Under the method of FIG. 4, the stop block 70 and the slide block 20 are nested together and secured to a frame member 132 to define the support channel 122 before the panel 100 is seated on either of the stop block 70 or the slide block 20. A similar set of stop and slide blocks 20 and 70 (not shown) are also secured to a frame member (not shown) on an opposite side of the enclosure frame 104 in order to define a similar support channel that is substantially aligned with the support channel 122, along a line that is generally perpendicular to the frame member 132 (i.e., generally to the right, from the perspective of FIG. 4). The panel 100 can then be slid (e.g., as indicated by the arrow 134) into the support channel 122 and the support channel (not shown) at the opposite side of the enclosure frame 104, and the panel 100 secured to the slide blocks 20 at respective mounting features (e.g., at the threaded hole 128 and a threaded hole 136).

Figure 5:
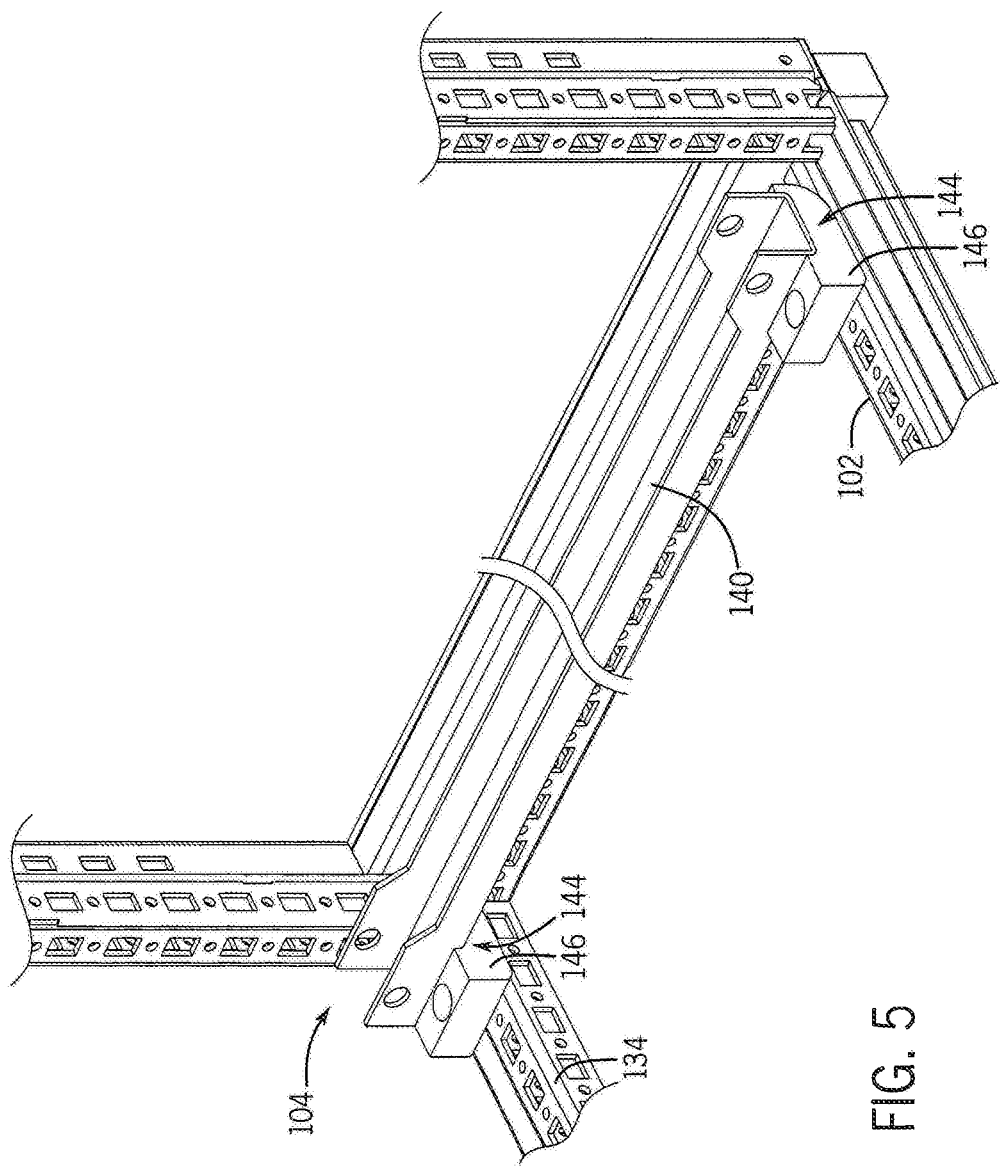
FIG. 5 is a front, right, top isometric view of another slide block configuration for use with the method of FIG. 4.

In some embodiments, an elongate channel structure can be disposed to extend between mounting blocks, in order to support an installation of the panel 100 in a manner similar to that illustrated in FIG. 4. As illustrated in FIG. 5, for example, an elongate channel member 140 is seated in respective support channels 122 of opposing slide blocks 144. The panel 100 (not shown in FIG. 5) can then be slid into place along the channel member 140, so that the panel is supported in the enclosure by the frame members 132 and 102, via the slide blocks 144 and the channel member 140. In some embodiments, the channel member 140 (or another channel member) can be similarly used with other mounting blocks, such as instances of the slide block 20 and the stop block 70 (not shown in FIG. 5).

Figure 6:
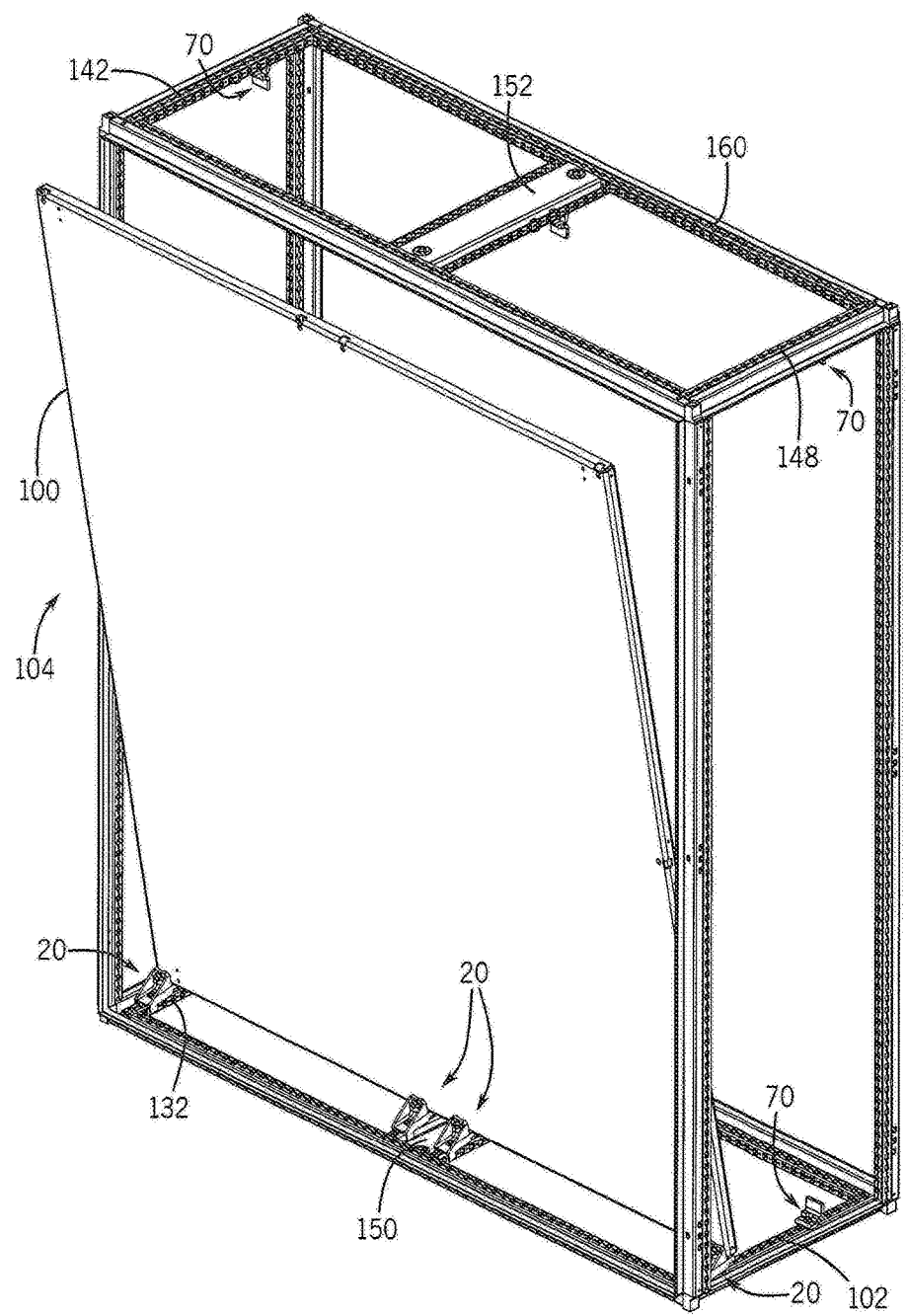
FIG. 6 is a front, right, top isometric view of yet another method for installing a panel into an enclosure using instances of the slide block of FIG. 1A and the stop block of FIG. 2A.

FIG. 6 illustrates another method for mounting the panel 100 within the enclosure frame 104 using multiple sets of the slide block 20 and the stop block 70. In the illustrated method, respective stop blocks 70 are secured to the lower side frame members 102 and 132 (only one such lower stop block 70 shown in FIG. 6), to a lower central frame member 150 (all stop blocks 70 on frame member 150 hidden from view in FIG. 6), to upper side frame members 146 and 148, and to an upper central frame member 152, at locations corresponding to a desired final orientation for a rear side of the panel 100. A lower end of the panel 100 is secured to a set of four of the lower slide blocks 20, and those slide blocks 20 are seated on the respective frame members 102, 132, and 150. If desired (and if not already appropriately tilted), the panel 100 and the slide blocks 20 can then be tilted forward relative to the enclosure frame 104 (i.e., out of the page and to the left in FIG. 6), and the slide blocks 20 slid along the frame members 102 and 132 until further movement is impeded by the contact of the slide blocks 20 with the lower set of the stop blocks 70. The panel 100 can then be tilted back towards vertical, until contact of the panel 100 with the upper stop blocks 70 (or the nesting of the lower sets of stop books 70 and slide blocks 20 together) prevents further movement of the panel 100. If desired, further slide blocks 20 (or other mounting blocks) can then be secured (not shown in FIG. 6) to the frame members 146, 148, and 152, and to the panel 100 (e.g., at an upper end of the panel 100), similarly to the embodiment illustrated in FIG. 7A. In this way, for example, the panel 100 can be slid to, and then rigidly secured in place at, a desired location within the enclosure frame 104.

In the embodiment illustrated in FIG. 6, four pairs of stop and slide blocks 20, 70 are used at the bottom of the enclosure frame 104, and four pairs of stop and slide blocks 20, 70 can be used at the top of the enclosure frame 104 (top slide blocks 20 not shown in FIG. 6). In some embodiments, a different number of the stop or slide blocks 20, 70 can be used. For example, in enclosures without the central frame members 150, 152, it may be possible to use two pairs of the stop and slide blocks 20, 70 at the top of the enclosure and two pairs of the stop and slide blocks 20, 70 at the bottom of the enclosure. Likewise, in other embodiments presented herein, the particular configurations of enclosures (e.g., the number and orientation of relevant frame members), and the corresponding particular arrangement of mounting blocks (e.g., the number, type, and location of the mounting blocks), are intended as examples only.

Figure 7A:
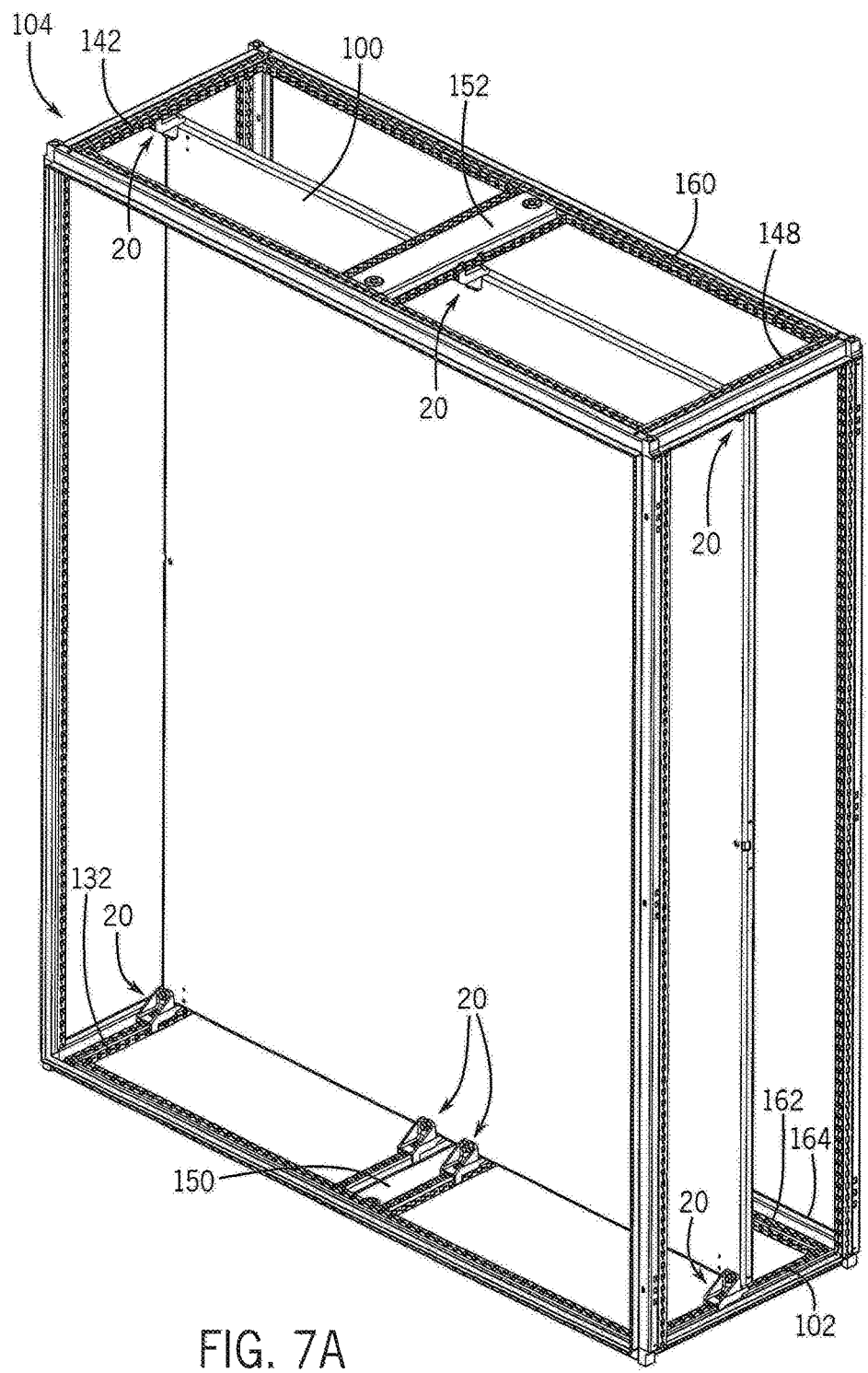
FIGS. 7A and 7B are front, right, top isometric views of still another method for installing a panel into an enclosure using instances of the slide block of FIG. 1A.

In some implementations of the disclosed method, multiple instances of the slide block 20 can be used to mount the panel 100 to the enclosure frame 104 without necessarily requiring the use of any instances of the stop block 70 (or other similar mounting block). As illustrated in FIG. 7A, for example, multiple instances of the slide block 20 have been attached to the corners and at central locations of the panel 100 and seated on the respective frame members 102, 132, 146, 148, 150, and 152. From this configuration, the slide blocks 20 can be slid along the respective frame members to any desired mounting location for the panel 100 within the enclosure frame 104. As desired, instances of the stop blocks 70 may or may not then be installed.

Figure 7B:
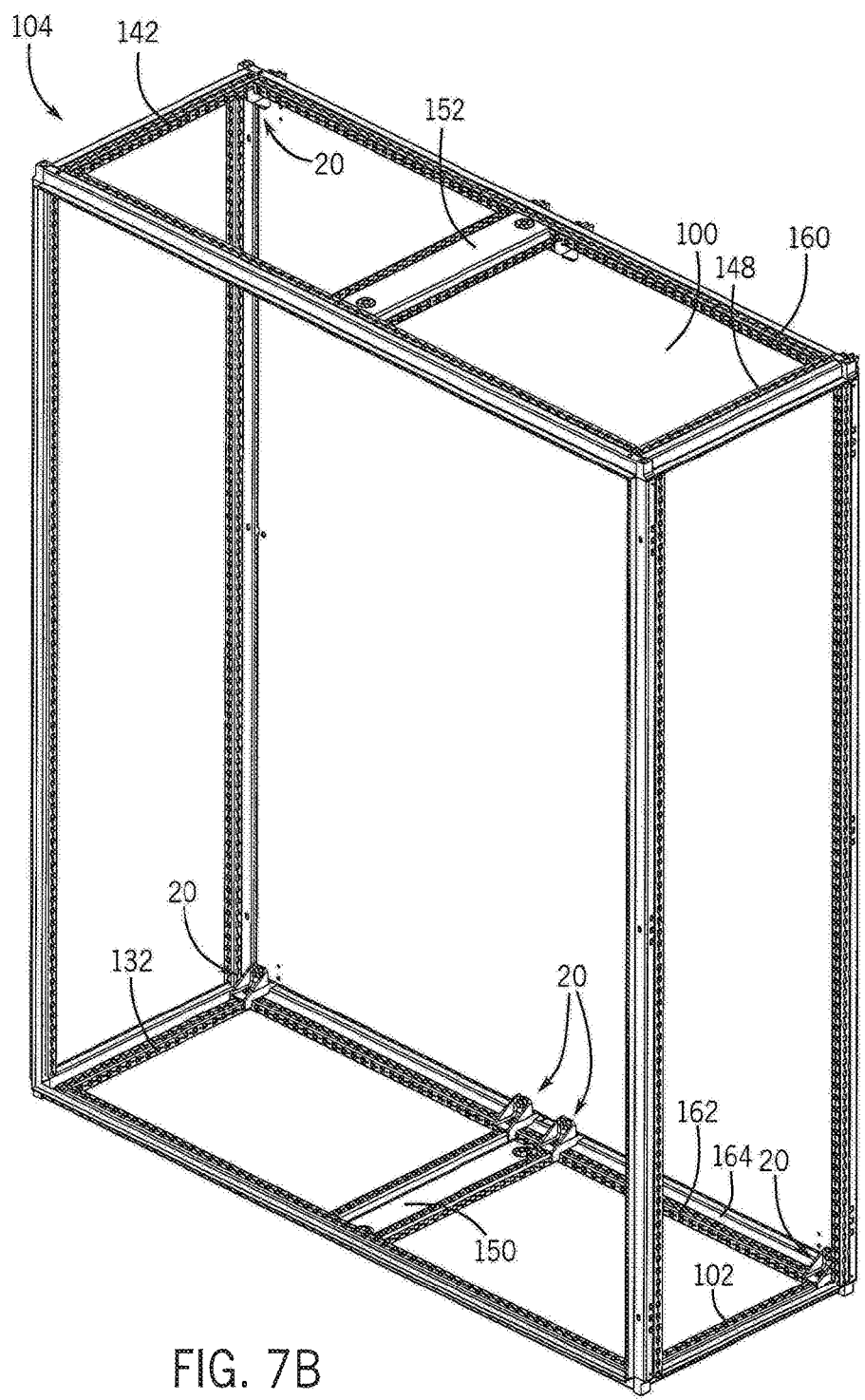

As illustrated in FIG. 7B, in some implementations, the desired mounting location for the panel 100 can coincide with a rear end of the frame of the enclosure frame 104. Accordingly, in some embodiments, the slide blocks 20 (or other mounting blocks) can be configured to engage, respectively, upper and lower rear frame members 160 and 162, in order to support the panel 100 relative to the enclosure frame 104. For example, as illustrated in detail in FIG. 8, the lower rear frame member 162 includes a flange 164 disposed behind and above a support surface 166 of the frame member 162. Correspondingly, the mating recess 54 and the support flange 50 of each of the lower slide blocks 20 is configured so that the support surface 56 of the support flange 50 can be seated on the flange 164 when the contact surface 42 of the slide block 20 is seated on the support surface 106 of the frame member 102. Accordingly, the flange 164 of the lower rear frame member 162, along with the support surface 106 of the frame member 102, can support the panel 100 via the slide block 20.

Figure 9A:
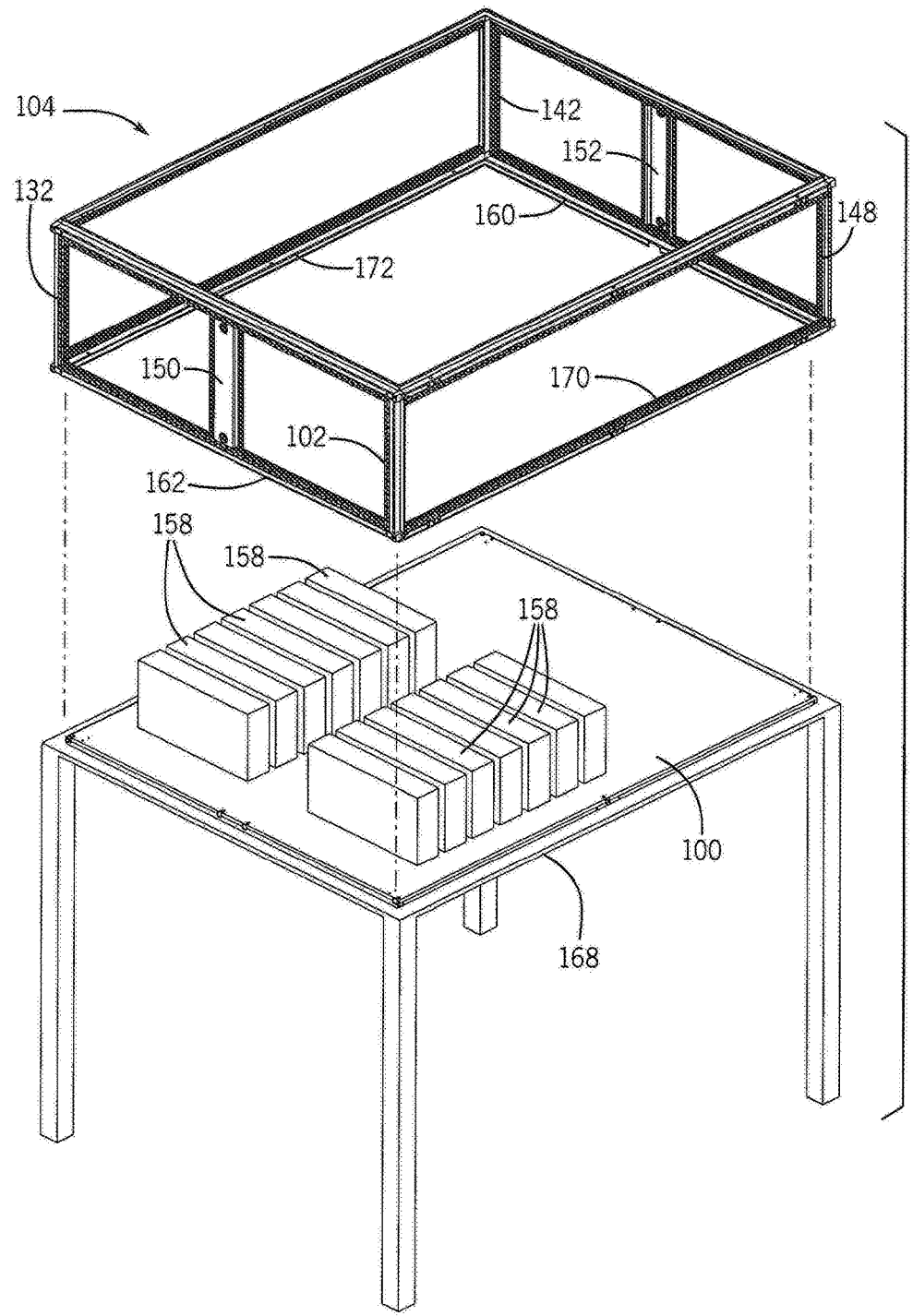
Figure 9B:
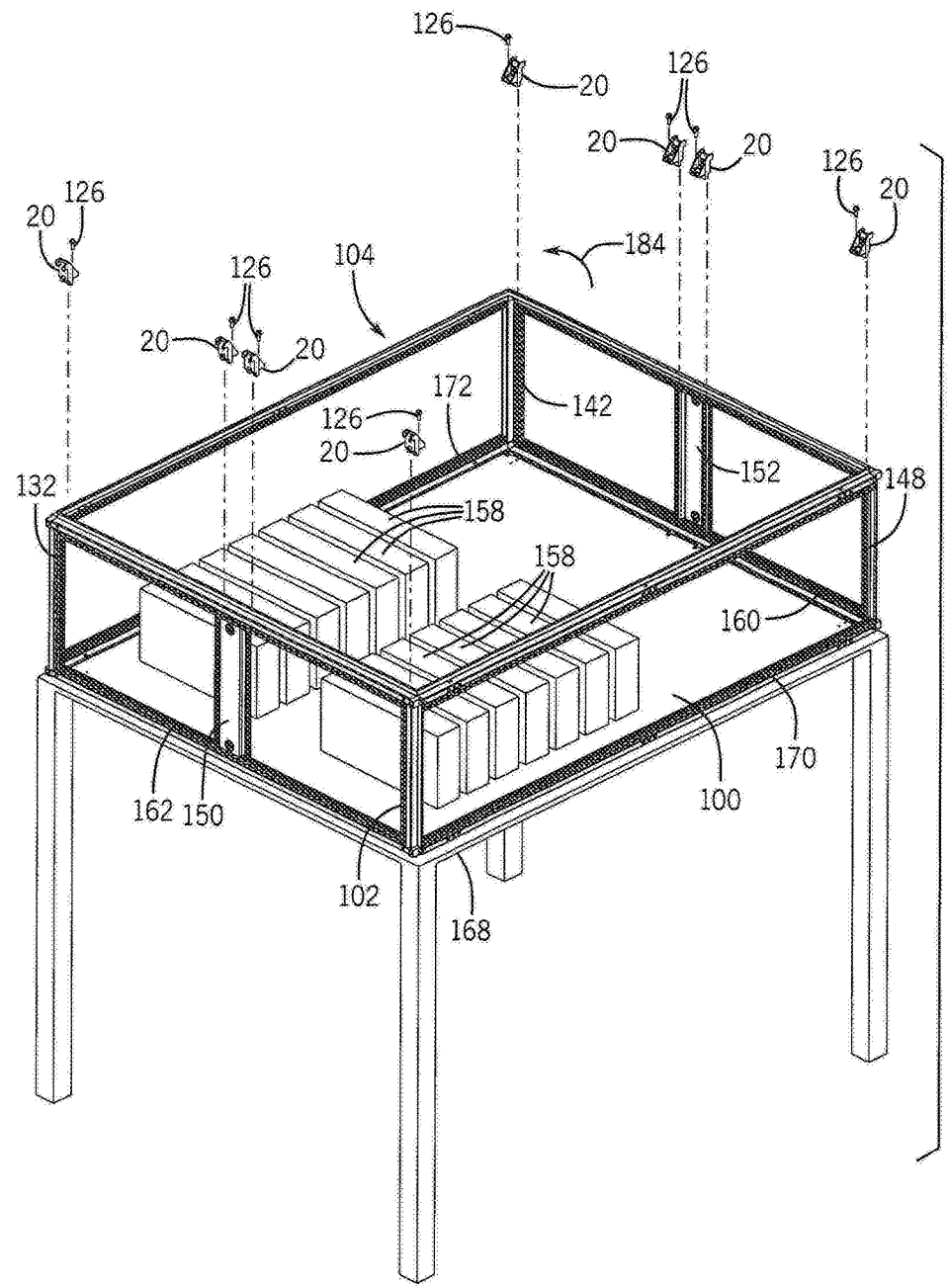

FIGS. 9A and 9B illustrate another method for mounting the panel 100 within the enclosure frame 104 using multiple sets of the slide block 20. Generally, the panel 100 (e.g., in a fully loaded configuration with electrical components 158) is first disposed in a horizontal orientation on a support surface of a support structure such as a work table 168. The enclosure frame 104 is disposed in a similar horizontal orientation above the panel 100, and then lowered onto the support structure (e.g., the work table 168) until enclosure frame 104 is aligned for attachment to the panel 100 (e.g., until the panel 100 is disposed between the upper and lower rear frame members 160 and 162, and side rear frame members 170 and 172). In this way, for example, it may be possible to avoid lifting and maneuvering the fully-loaded panel 100 separately from the enclosure frame 104. For example, the panel 100 can be moved in an unloaded configuration into position on the work table 168, and electrical components installed on the panel 100 before or after the panel 100 is secured to the enclosure frame 104.

With the panel 100 appropriately disposed relative to the enclosure frame 104 and electrical components appropriately installed, a number of the slide blocks 20 can be secured to the panel 100 (e.g., using a similar number of the bolts 126), as well as to the frame members 102, 132, 142, 148, 150, and 152 (e.g., using a number of cage nuts (not shown in FIGS. 9A and 9B)). The panel 100 and enclosure frame 104 can then be collectively rotated to a vertical orientation (e.g., as indicated by arrow 184), with the respective support shelves 52 and contact surfaces 42 of the slide blocks 20 (see, e.g., FIGS. 1A and 1B) securing the panel 100 to and supporting the panel 100 relative to, the enclosure frame 104. In some embodiments, as similarly discussed above with regard to FIG. 8, the respective support flanges 50 of the slide blocks 20 (see, e.g., FIGS. 1A and 1B) can engage (e.g., be seated on) respective flanges of the rear frame members 160 and 162 (e.g., the flange 164, as illustrated in FIG. 8) in order to further support the panel 100 once (and while) the assembly is rotated to the vertical orientation.

Figure 8:
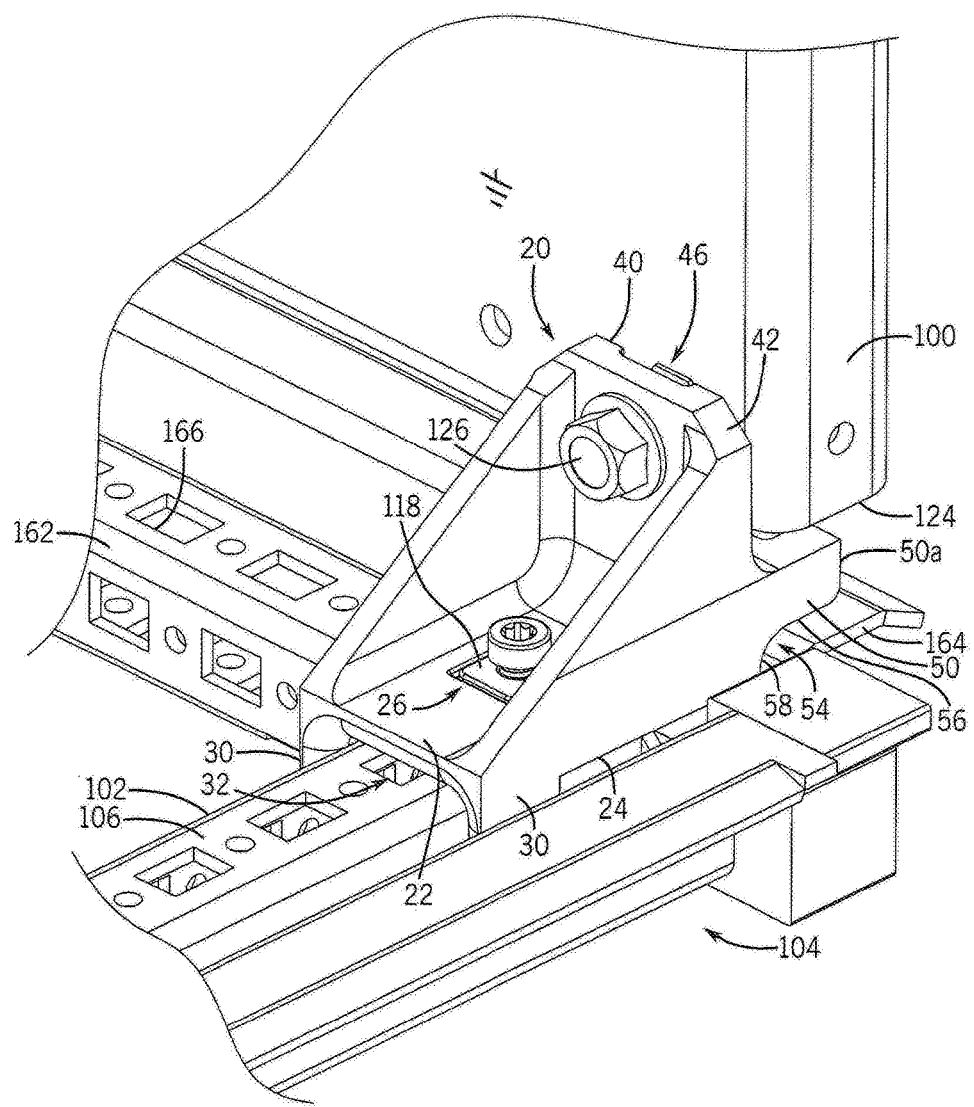
FIG. 8 is an enlarged front, right, top isometric view of the slide block of FIG. 1A after the completion of the method of FIGS. 7A and 7B FIGS. 9A and 9B are front, right, top isometric views of yet another method for installing a panel into an enclosure using instances of the slide block of FIG. 1A.

In some implementations, a particular mounting method described herein, such as the mounting method illustrated in FIGS. 9A and 9B, can be combined with other mounting methods. For example, after the panel 100 has been mounted as illustrated in FIG. 9B and the panel 100 and enclosure frame 104 rotated to the vertical orientation, the panel 100 may be disposed at the rear of the enclosure frame 104 (e.g., as illustrated in FIGS. 7B and 8). In some implementations, the panel 100 can then be slid to another desired location on the enclosure frame 104, as supported by the various slide blocks 20. For example, after being rotated to the vertical orientation, the panel 100 can be slid from the rear of the enclosure frame 104 (e.g., as illustrated in FIG. 7B) to a central location in the enclosure frame 104 (e.g., as illustrated in FIG. 7A). As appropriate, various of the stop blocks 70 (see, e.g., FIGS. 2A and 2B) can then be nested with the various slide blocks 20 (e.g., as illustrated in FIGS. 3 and 4) to further secure the panel 100 to the enclosure frame 104.

Figure 10:
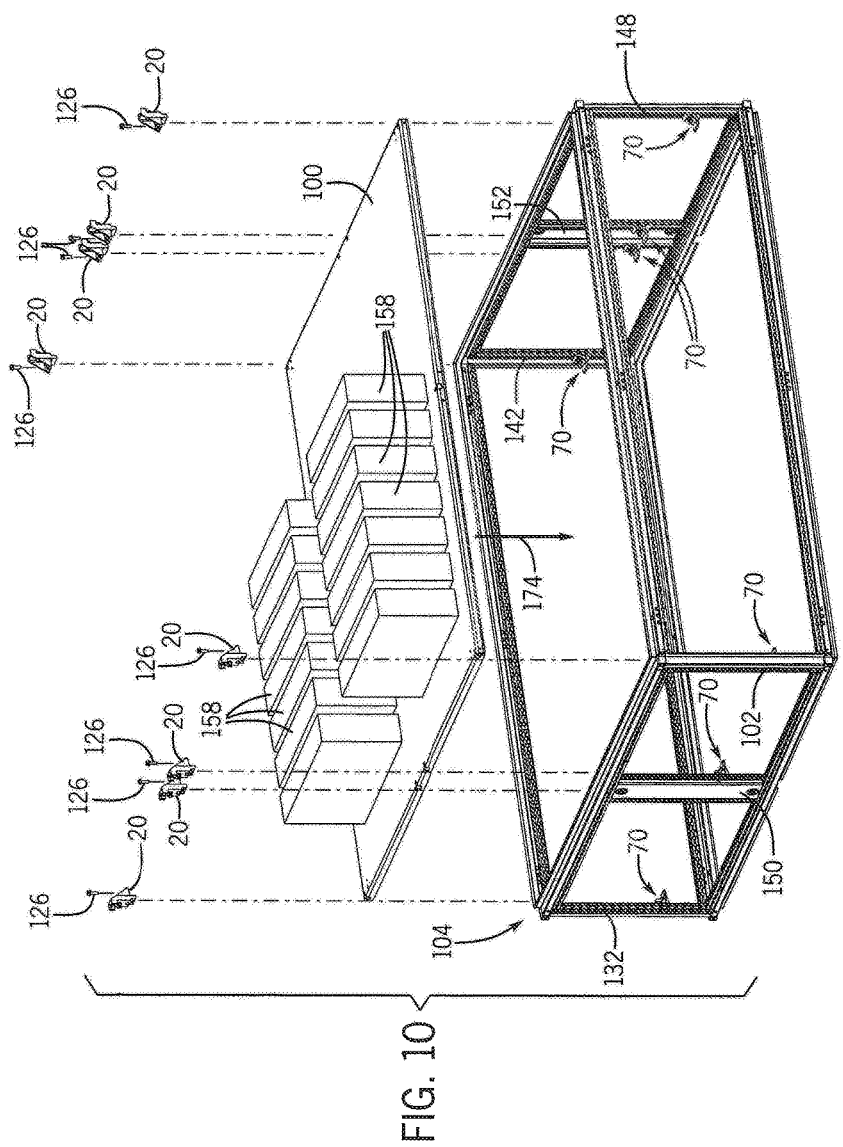
FIG. 10 is a front, right, top isometric view of a further method for installing a panel into an enclosure using instances of the slide block of FIG. 1A and the stop block of FIG. 2A.

FIG. 10 illustrates another method for mounting the panel 100 within the enclosure frame 104, similar to the method illustrated in FIGS. 9A and 9B. As illustrated in FIG. 10, the enclosure frame 104 is disposed in a horizontal orientation and a set of four of the stop blocks 70 secured, respectively, to the frame members 102, 132, 142, 148, 150, and 152. The panel 100 is then be lifted above the enclosure frame 104 in a horizontal orientation, and then lowered (e.g., as illustrated by the arrow 184) onto the stop blocks 70. With the stop blocks 70 accordingly supporting the weight of the panel 100, a set of four of the slide blocks 20 are attached to the panel 100 (if not attached already) as well as to the respective frame members 102, 132, 142, 148, 150, and 152. With the panel 100 thus secured in place relative to the enclosure frame 104, the enclosure frame 104 and the panel 100 are then collectively rotated to a vertical orientation (not shown in FIG. 10). In this way, for example, it may be possible to avoid unwieldy manual maneuvering of the panel 100 (e.g., in a fully loaded state). For example, the panel 100 can be fully loaded, then raised into position above the enclosure frame 104 using a mechanical, hydraulic or other lift, before being lowered by the lift into the desired orientation for attachment to the enclosure frame 104. Alternatively, for example, a lift can be used to raise the panel 100 above the enclosure frame 104 and then lower the panel 100 for attachment to the enclosure frame 104, after which appropriate equipment can be installed on the panel 100.

Figure 11A:
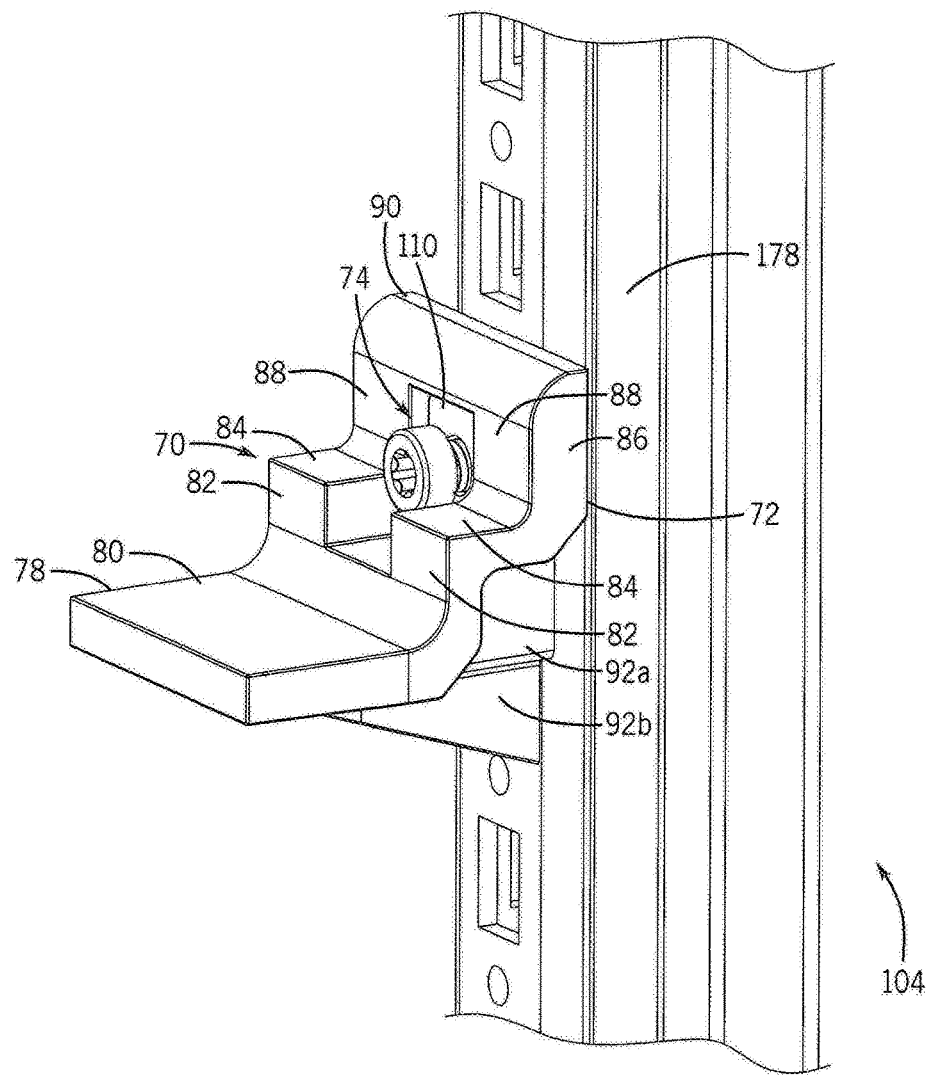
FIGS. 11A and 11B are front, right, top isometric views of a still further method for installing a panel into an enclosure using instances of the slide block of FIG. 1A and the stop block of FIG. 2A, with the panel configured as a shelf.
Figure 11B:
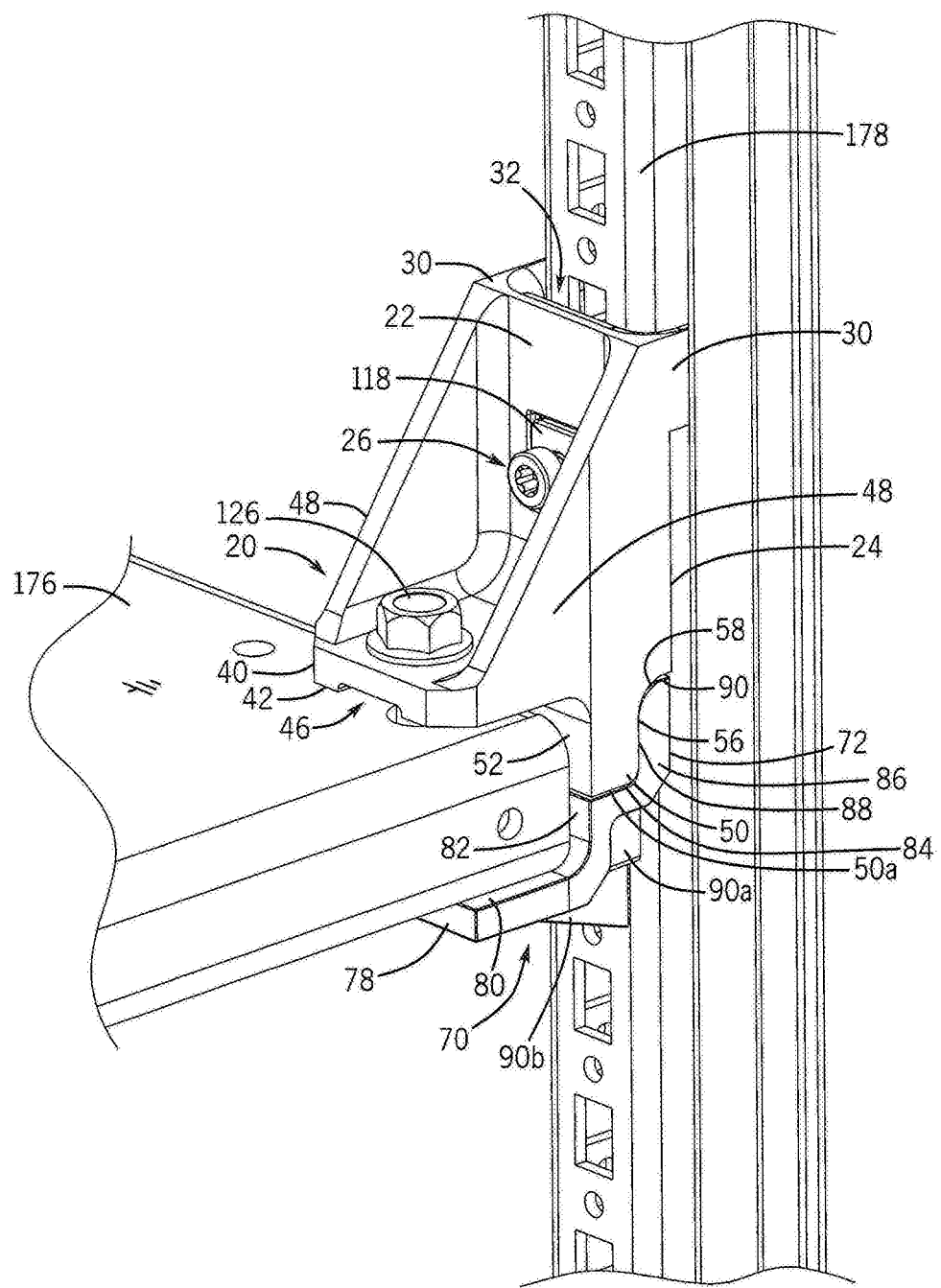

FIGS. 11A and 11B illustrate a similar method to the method illustrated in FIG. 10, but with a panel configured as a shelf 174 (e.g., a battery shelf), rather than as a vertical panel such as the panel 100. In the method illustrated in FIGS. 11A and 11B, a set of the stop blocks 70 (only one shown in FIGS. 11A and 11B) are secured to vertical frame members of the enclosure frame 104 (e.g., to a frame member 178). The shelf 176 is then slid (e.g., horizontally) or lowered (e.g., vertically) onto the stop blocks 70. With the shelf 176 in place, each of a set of the slide blocks 20 (only one shown in FIGS. 11A and 11B) can be nested with a respective one of the stop blocks 70 (e.g., as also described above) and then secured to the shelf 176 (if not already attached thereto) and to the relevant frame members (e.g., the frame member 178). In this way, for example, the shelf 176 or other similar panels or components can be supported at any number of heights relative to the enclosure frame 104.

In some implementations, a panel can be installed similarly to the installation illustrated in FIGS. 11A and 11B. In contrast to the method of FIGS. 11A and 11B, however, a set of slide blocks 20 can be used in place of one or more of the stop blocks 70.

Figure 12:
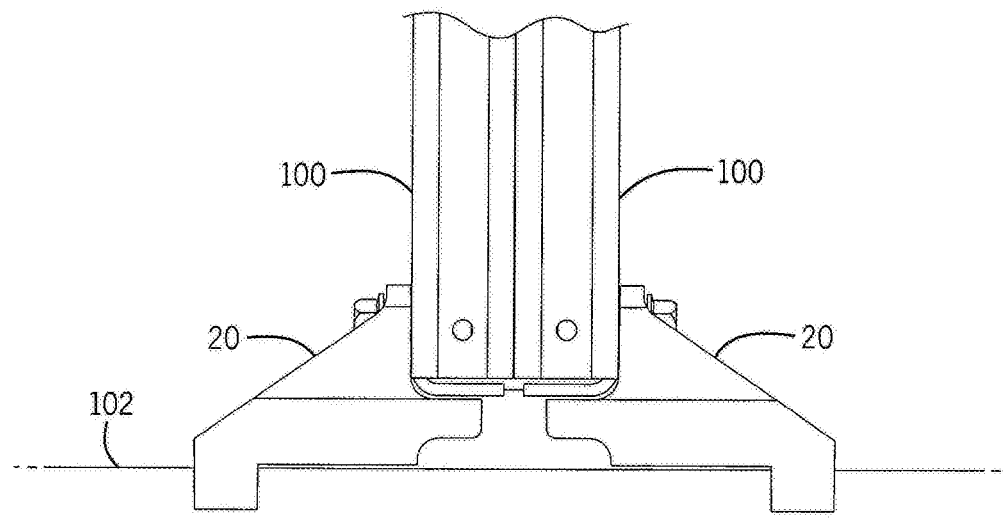
FIG. 12 is a left elevation view of a mounting arrangement for two panels, using two instances of the slide block of FIG. 1A.

In some embodiments, the disclosed mounting blocks can be used to mount panels back-to-back within an enclosure. For example, as illustrated in FIG. 12, respective slide blocks 20 to support respective panels 100 are secured to the frame member 102 in opposite orientations. As such, the panels 100 can be supported by the respective slide blocks 20 in a back-to-back configuration.

Figure 13:
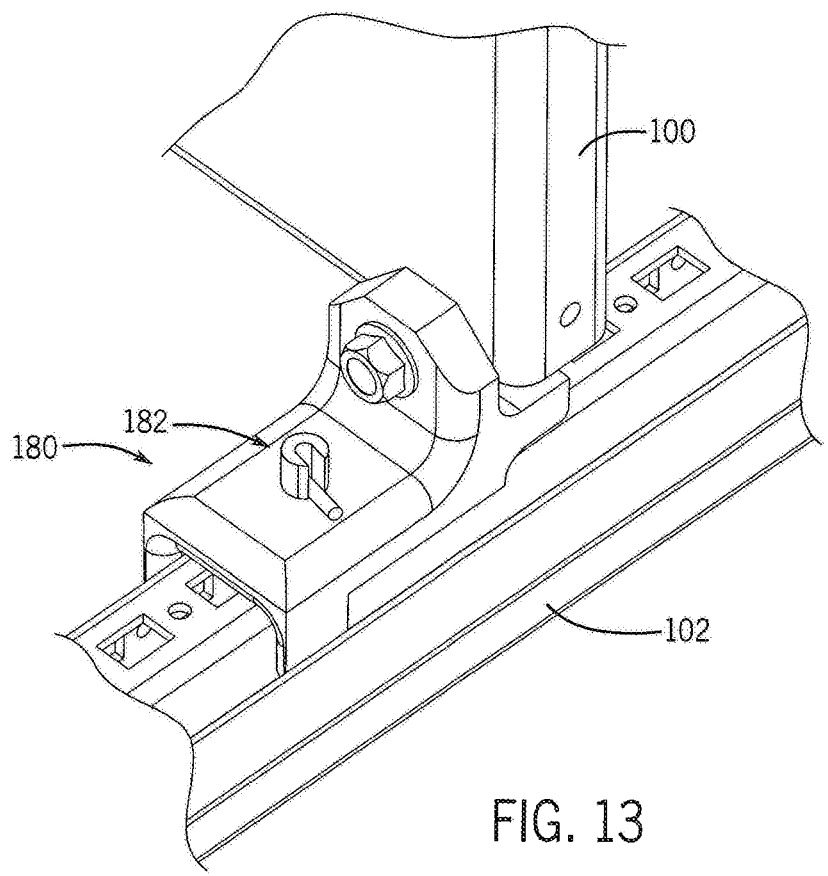
FIG. 13 is a front, right, top isometric view of another slide block according to one embodiment of the invention.

In some embodiments, a mounting feature for a mounting block can include a quick-release mechanism. As illustrated in FIG. 13, for example, a slide block 180 can be configured somewhat similarly to the slide block 20, with guide legs, a slide surface, a support shelf, and so on. In contrast to the slide block 20, however, the slide block 180 includes a quick-release mechanism, configured as a quick-release plunger 182, for securing the slide block 180 to the frame member 102. In other embodiments, other types of engagement or locking mechanisms can additionally (or alternatively) be used to secure a slide block (or other mounting block) at a desired location on a frame member.

Some example installations presented above employ multiple mounting blocks. In some implementations, multiple similarly configured mounting blocks (e.g., multiple instances of the slide block 20 and the stop block 70) can be used together to mount a panel within an enclosure. In some implementations, other combinations of mounting blocks can additionally (or alternatively) be used. For example, in some implementations, in order to mount a panel to an enclosure frame, one instance of the slide block 20 (or the stop block 70) can be used, along with one or more differently configured slide blocks (or stop blocks). For example, a combination of multiple instances of the slide block 20 (see FIGS. 1A and 1B), multiple instances of the slide block 180 (see FIG. 13), and one or more stop blocks (e.g., similar to the stop block 70) can be used to secure a particular panel within a particular enclosure.

Thus, embodiments of the disclosure provide for an improved mounting arrangement for securing a panel within an enclosure. The disclosed mounting arrangement, and corresponding methods, can provide for highly customizable mounting of panels at different locations and orientations within an enclosure. Further, the disclosed mounting arrangement, including as used in the disclosed methods, can provide for a connection between an enclosure frame and multiple points on a panel that is relatively strong in comparison to conventional arrangements.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A system for mounting a panel within an enclosure, the enclosure including an enclosure frame with a plurality of frame members, the system comprising:
    a plurality of slide blocks, each slide block including a slide-block support shelf that is configured to receive and support the panel and that is, when the slide block is seated on a support surface of a corresponding one of the frame members, at least partly separated from the support surface by a recess between the slide block and the support surface;
    a plurality of stop blocks, each of the stop blocks including:
        a stop surface; and
        a tongue configured to nest within the recess between a corresponding one of the slide blocks and the support surface of the corresponding frame member;
    the slide blocks being configured to provide a first installation configuration, in which:
        with the panel in a horizontal orientation on a support structure and the enclosure frame in a horizontal orientation in alignment with the panel, securing the slide blocks to the panel and to the frame members secures the panel to the enclosure frame; and
        the slide blocks continue to secure the panel to the enclosure frame as the enclosure frame and the panel are collectively rotated to a vertical orientation; and
    the slide blocks and the stop blocks being configured to provide a second installation configuration, in which:
        with the panel and the enclosure frame in respective horizontal orientations, the stop blocks are secured to the frame members with the stop surfaces disposed to receive and support the panel as the panel is lowered relative to the enclosure frame;
        with the panel supported on the stop surfaces, the slide blocks are secured to the frame members with the tongues of the stop blocks nested within the recesses between the slide blocks and the support surfaces of the corresponding frame members; and
        the slide blocks and the stop blocks collectively secure the panel to the enclosure frame as the enclosure frame and the panel are collectively rotated to the vertical orientation.

2. The system of claim 1, wherein the slide blocks and the stop blocks are further configured to provide a third installation configuration, in which, with the enclosure frame in the vertical orientation:
    a first set of the stop blocks are secured to a bottom set of the frame members;
    a first set of the slide blocks are secured to a bottom end of the panel and seated on the bottom set of the frame members;
    the slide blocks of the first set are slid along the bottom set of the frame members until the tongues of the stop blocks of the first set are aligned with the recesses between the slide blocks of the first set and the support surfaces of the corresponding frame members; and
    with the tongues of the stop blocks of the first set nested within the recesses between the slide blocks of the first set and the support surfaces of the corresponding frame members, the slide blocks of the first set are secured to bottom set of the frame members.

3. The system of claim 2, wherein each of the slide blocks includes:
    a slide surface configured to seat on and slide along the support surface of the corresponding frame member; and
    guide legs configured to extend at least partly along two sides of the corresponding frame member when the slide surface is seated on the support surface; and
    wherein the slide blocks are configured to be tilted to slide along the bottom set of the frame members, as guided by an engagement of the guide legs with the bottom set of the frame members, with the slide surfaces and the panel oriented at an oblique angle relative to the support surfaces of the bottom set of the frame members.

4. The system of claim 3, wherein, in the third installation configuration:
    a second set of the stop blocks are secured to a top set of the frame members;
    wherein, as the panel is rotated from the oblique angle toward the vertical orientation, the stop blocks of the second set prevent rotation of the panel past the vertical orientation; and
    wherein, with the stop blocks of the second set preventing rotation of the panel past the vertical orientation, a second set of the slide blocks are secured to the panel and to the top set of the frame members to secure the panel in the vertical orientation.

5. The system of claim 2, wherein the slide blocks and the stop blocks are further configured to provide a fourth installation configuration, in which:
    the stop blocks and the slide blocks are secured to the bottom set of the frame members with the tongues of the stop blocks nested within the recesses between the slide blocks and the support surfaces of the corresponding frame members, so that pairs of the stop blocks and the slide blocks each define a respective u-shaped support channel; and
    the panel is slid laterally into at least two of the u-shaped support channels to secure the panel to the enclosure frame.

6. The system of claim 5, further comprising:
    a channel member configured to extend between two of the u-shaped support channels to receive and support the panel.

7. The system of claim 1, wherein each of the stop blocks includes a stop-block support shelf that is distinct from the stop surface of the stop block and is configured to receive and support the panel; and
    wherein, with the enclosure frame and the panel in the vertical orientation, the stop-block support shelves support the panel relative to the enclosure frame.

8. The system of claim 1, wherein in the first installation configuration and the second installation configuration, a plurality of electrical components are secured to the panel before the enclosure frame and the panel are collectively rotated to the vertical orientation.

9. A system for mounting a panel within an enclosure and for use with a stop block that includes a tongue, the enclosure including an enclosure frame with a frame member, the system comprising:
  a slide block that is configured to be selectively moved along and connected to the frame members;
  the slide block including:
    a slide-block support shelf that is configured to receive and support the panel;
    a slide surface configured to seat on and slide along a support surface of the frame member; and
    guide legs configured to extend at least partly along two sides of the frame member when the slide surface is seated on the support surface,
    the guide legs being configured to engage the two sides of the frame member to guide sliding movement of the slide block along the support surface of the frame member;
  wherein the slide block defines a recess between the slide block and the support surface of the frame member, opposite the guide legs, when the slide surface is seated on the support surface; and
  wherein the recess is configured to receive the tongue to dispose the stop block and the slide block in a nested configuration to secure the panel to the frame member.

10. The system of claim 9, with the stop block including a stop-block support shelf, wherein the slide-block support shelf is configured to be aligned with the stop-block support shelf to cooperatively support the panel, when the tongue is received in the recess.

11. The system of claim 10, wherein the slide block is configured to form, cooperatively with the stop block, a support channel to receive the panel, when the tongue is received in the recess, the support channel including the stop-block and slide-block support shelves.

12. The system of claim 11, wherein the support channel is opposite the recess from the frame member.

13. The system of claim 9, with the frame member configured as a bottom, side frame member and the enclosure frame including a rear frame member adjacent to an end of the side frame member, wherein the recess is configured to receive a flange of the rear frame member to further support the panel, when the slide block is secured at the end of the bottom, side frame member.

14. The system of claim 9, further comprising the stop block.

15. The system of claim 14, wherein the slide block includes a stop surface that is substantially perpendicular to the slide-block support shelf; and
  wherein the slide block and the stop block are configured to provide an installation configuration, in which:
    with the panel and the enclosure frame in respective horizontal orientations, the stop block is secured to the frame member with the stop surface disposed to receive and support the panel as the panel is lowered vertically relative to the enclosure frame;
    with the panel supported on the stop surface, the slide block is secured to the frame member with the tongue of the stop block nested within the recess between the slide block and the support surface of the frame member; and
    the slide block and the stop block collectively secure the panel to the enclosure frame as the enclosure frame and the panel are collectively rotated to a vertical orientation.

16. The system of claim 14, with the frame member configured as a bottom frame member, wherein the slide block and the stop block are configured to provide an installation configuration, in which, with the enclosure frame in a vertical orientation:
  the stop block is secured to the bottom frame member;
  the slide block is secured to a bottom end of the panel and the slide surface is seated on the support surface of the bottom frame member;
  the slide block is slid along the support surface of the bottom frame member until the tongue of the stop blocks of the first set is aligned with the recess between the slide block and the support surface of the bottom frame member; and
  with the tongue of the stop block nested within the recess, the slide block is secured to the bottom frame member.

17. The system of claim 16, wherein the slide block is configured to be slid along the support surface of the bottom frame member with the slide surface and the panel angled obliquely relative to the support surface; and
  wherein the slide block is configured to be secured to the bottom frame member with the panel substantially perpendicular to the support surface.

18. The system of claim 17, with the enclosure frame including a top frame member opposite the bottom frame member and with the stop block being a first stop block, the system further comprising:
  a second stop block substantially identical to the first stop block;
  wherein, in the installation configuration, the second stop block is secured to the top frame member opposite the first stop block; and
  wherein, as the panel is rotated from being obliquely angled, the second stop block stops rotation of the panel with the panel substantially perpendicular to the support surface.

19. The system of claim 9, for use with a support structure, wherein the slide block is configured to provide an installation configuration, in which:
  with the panel in a horizontal orientation on the support structure and the enclosure frame in a horizontal orientation in alignment with the panel, the slide block is secured to the panel and to the frame member to secure the panel to the enclosure frame; and
  the slide block continues to secure the panel to the enclosure frame as the enclosure frame and the panel are collectively rotated to a vertical orientation.

\* \* \* \* \*